United States Patent
Haynie et al.

(10) Patent No.: US 12,520,542 B2
(45) Date of Patent: Jan. 6, 2026

(54) CORRUGATED METAL OXIDE SEMICONDUCTOR TRANSISTOR

(71) Applicant: Texas Instruments Incorporated, Dallas, TX (US)

(72) Inventors: Sheldon Douglas Haynie, Myrtle Beach, SC (US); Alexei Sadovnikov, Sunnyvale, CA (US); Brian Goodlin, Plano, TX (US)

(73) Assignee: TEXAS INSTRUMENTS INCORPORATED, Dallas, TX (US)

( * ) Notice: Subject to any disclaimer, the term of this patent is extended or adjusted under 35 U.S.C. 154(b) by 723 days.

(21) Appl. No.: 17/829,009

(22) Filed: May 31, 2022

(65) Prior Publication Data
US 2023/0411452 A1    Dec. 21, 2023

(51) Int. Cl.
*H10D 62/10* (2025.01)
*H10D 30/01* (2025.01)
*H10D 30/62* (2025.01)
*H10D 30/65* (2025.01)

(52) U.S. Cl.
CPC ......... *H10D 62/117* (2025.01); *H10D 30/024* (2025.01); *H10D 30/0281* (2025.01); *H10D 30/6212* (2025.01); *H10D 30/65* (2025.01)

(58) Field of Classification Search
CPC ........... H10D 30/6212; H10D 30/0281; H10D 30/0285; H10D 30/603; H10D 30/0221; H10D 30/65; H10D 30/608; H10D 30/024; H10D 62/117; H10D 62/307; H10D 64/516; H10D 62/155; H10D 30/0212; H10D 62/159; H10D 62/116; H10D 62/235; H10D 64/112; H10D 30/658; H10D 64/117; H10D 62/158; H10D 62/154; H10D 62/292; H10D 64/021; H10D 64/513; H10D 30/0289; H10D 62/393; H10D 62/125; H10D 64/62; H10D 62/83; H10D 84/038; H10D 84/0147; H10D 64/018; H10D 62/126; H10D 84/83; H10D 62/107; H10D 84/013; H10D 62/378; H01L 21/32137; H01L 21/26513; H01L 21/76229; H01L 21/76232; H02M 3/158

See application file for complete search history.

(56) References Cited

U.S. PATENT DOCUMENTS 4,732,841 A    3/1988 Radigan
10,978,559 B1    4/2021 Haynie et al.
(Continued)

*Primary Examiner* — Mouloucoulaye Inoussa
(74) *Attorney, Agent, or Firm* — Yudong Kim; Frank D. Cimino

(57) ABSTRACT

A method forms a semiconductor device with a substrate including semiconductor material formed to include plural corrugation members, each member including a top surface, and a first and second sidewall extending from the top surface to a lower surface. The method forms a contiguous transistor source extending through a first volume of each of the corrugation members and a first lower surface volume and a contiguous transistor drain extending through a second volume of each of the corrugation members and a second lower surface volume. Both source and drain are formed by initially diffusing a dopant in a uniform manner normal to various portions, some non-coplanar, of the source and drain, respectively.

22 Claims, 29 Drawing Sheets

(56) References Cited

U.S. PATENT DOCUMENTS

| | | | |
|---|---|---|---|
| 2009/0140343 A1* | 6/2009 | Feilchenfeld | H10D 30/0289 |
| | | | 257/E29.256 |
| 2010/0006934 A1* | 1/2010 | Su | H10D 30/603 |
| | | | 257/341 |
| 2013/0277741 A1* | 10/2013 | Guowei | H10D 30/603 |
| | | | 257/E29.256 |
| 2014/0021534 A1* | 1/2014 | Verma | H10D 84/038 |
| | | | 438/270 |
| 2016/0049464 A1* | 2/2016 | Lin | H10D 30/0221 |
| | | | 438/286 |
| 2016/0111488 A1* | 4/2016 | Lu | H10D 64/117 |
| | | | 438/270 |
| 2019/0172946 A1* | 6/2019 | Wu | H10D 30/65 |
| 2019/0280094 A1* | 9/2019 | Grote | H10D 84/83 |
| 2020/0176599 A1* | 6/2020 | Mehrotra | H10D 64/513 |
| 2020/0303542 A1* | 9/2020 | Mo | H01L 21/76229 |
| 2021/0028299 A1* | 1/2021 | Liu | H10D 30/65 |
| 2021/0184034 A1* | 6/2021 | Mehrotra | H10D 62/116 |
| 2021/0359132 A1* | 11/2021 | Mun | H10D 30/658 |

* cited by examiner

CORRUGATED METAL OXIDE SEMICONDUCTOR TRANSISTOR

CROSS-REFERENCE TO RELATED APPLICATION

Not applicable.

BACKGROUND

The example embodiments relate to semiconductor fabrication and devices, for example with respect metal oxide semiconductor (MOS) transistors in semiconductor devices.

Transistors are typically used as a switch or an amplifier, and often are critical components, in an integrated circuit (IC). As IC technology has advanced, the number of transistors in an IC has increased, while to reduce the IC size, transistor size has been reduced. A standard metal oxide semiconductor field effect transistor (MOSFET) is typically measured by its gate length, which also relates to the distance between its source and drain. Accordingly, as MOSFET size has been reduced, the source-to-drain distance likewise is reduced, which increases the chance of current leakage between the source and drain. Some leakage makes the MOSFET less efficient, and too much leakage makes a MOSFET unusable for an application.

Some MOS transistors include extended drains, commonly referred to as extended drain MOS or drain extended MOS (DEMOS) transistors. An extended drain MOS transistor may be operated with a higher potential on the drain than on the gate and may be used in a power circuit. In a planar MOSFET, a laterally-diffused MOS (LDMOS) includes an extended drain, typically formed with multiple ion implantation sequences to establish a desired doping profile and resulting characteristic to withstand high electric fields. Another form of extended drain device is shown in co-owned U.S. Pat. No. 10,978,559, issued Apr. 13, 2021, and fully incorporated herein by reference. In U.S. Pat. No. 10,978,559, a DEMOS is illustrated with a corrugated structure, formed from the combined paths of plural corrugation regions that extend from a semiconductor substrate. Each of the plural corrugation regions provides a topology with a lateral surface extending away from the semiconductor substrate, followed by a corrugated top surface, followed by another lateral surface extending back to the semiconductor substrate, followed by a lower portion along or near the substrate surface, and then repeating the preceding for each extending corrugation region. Also in this topology, various of the transistor structures (e.g., source, drain, drift, gate/field plate) extend continuously along the plural corrugation regions and their surfaces, including therefore the corrugated top surfaces, the lateral (e.g., vertical) surfaces, and the lower portions along or near the substrate surface. The entirety of the corrugation regions thereby provide corresponding conductive paths along the corrugation, so that such paths may be provide an effective width in a physical device using a smaller area as compared to prior planar DEMOS devices.

Example embodiments may improve on certain of the above concepts, as detailed below.

SUMMARY

A method of forming a semiconductor device, including providing a substrate including at least a portion of a semiconductor material; forming a plurality of corrugation members of the semiconductor material, each corrugation member in the plurality of corrugation members including a top surface, and a first and second sidewall extending from the top surface to a lower surface; forming a contiguous transistor source extending through a first volume of each of the corrugation members and a first lower surface volume extending into the semiconductor material from the lower surface by initially diffusing a dopant in a uniform manner normal to a first portion of the top surface, a first portion of the first sidewall, a first portion of the second sidewall, and a first portion of the lower surface; and forming a contiguous transistor drain extending through a second volume of each of the corrugation members and a second lower surface volume extending into the semiconductor material from the lower surface by initially diffusing the dopant in a uniform manner normal to a second portion of the top surface, a second portion of the first sidewall, a second portion of the second sidewall, and a second portion of the lower surface.

Other aspects are also described and claimed.

DETAILED DESCRIPTION

Figure 7:
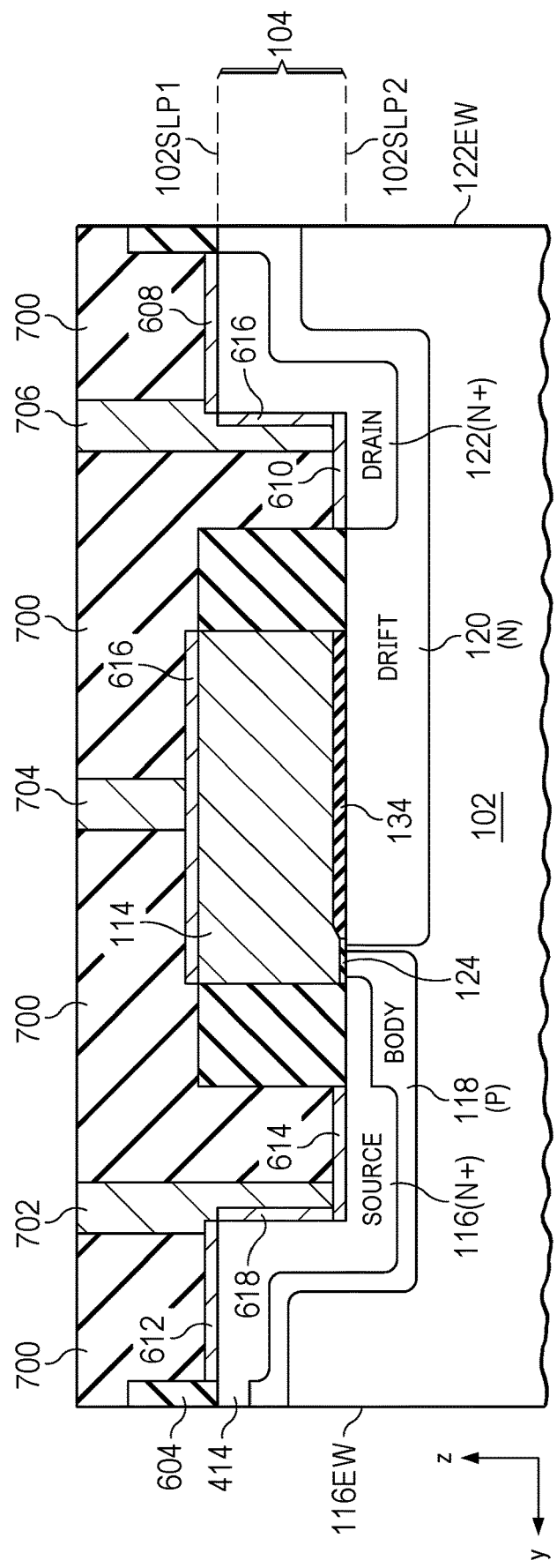
FIG. 7 is a successive view of FIG. 6C, illustrating additional fabrication steps and the formation of a metal contacts.
Figure 8:
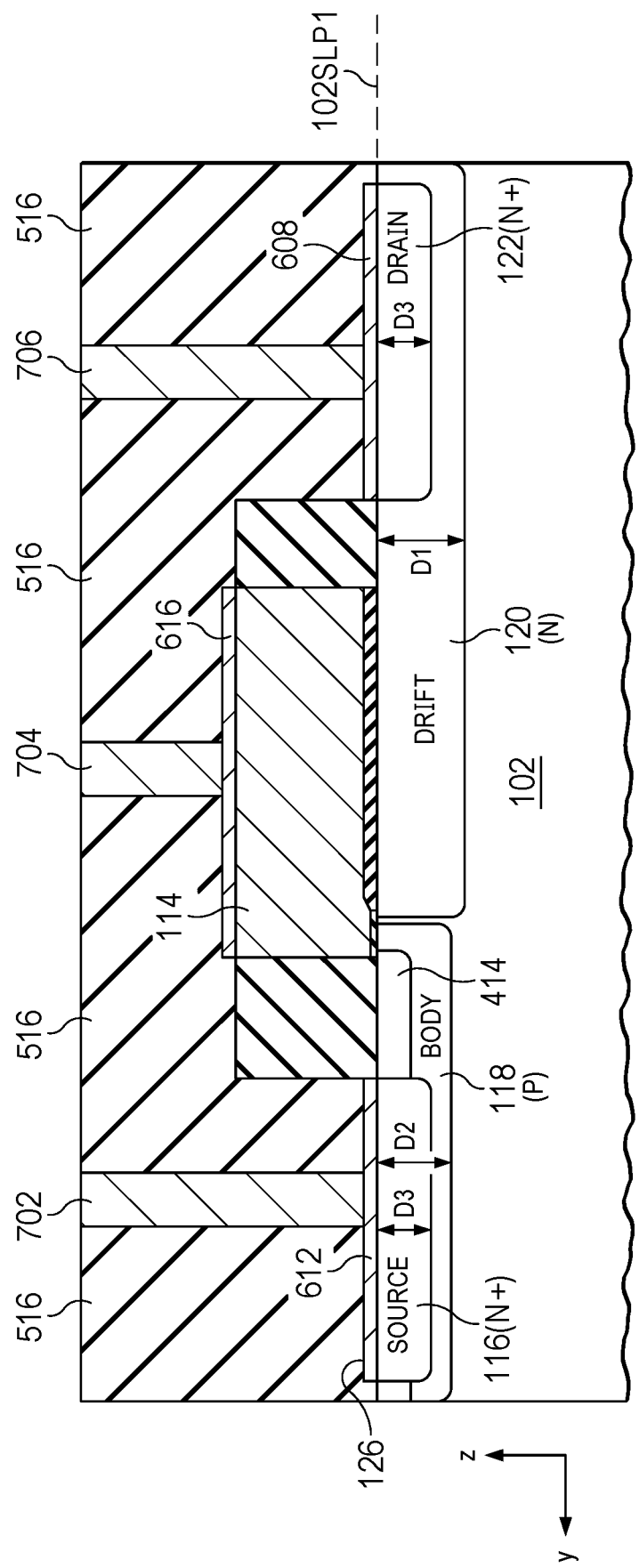
FIG. 8 is a cross-section view of the FIG. 1C folded DEMOS transistor at the same stage of fabrication stage as in FIG. 7, with view instead taken across a corrugation member.
Figure 9:
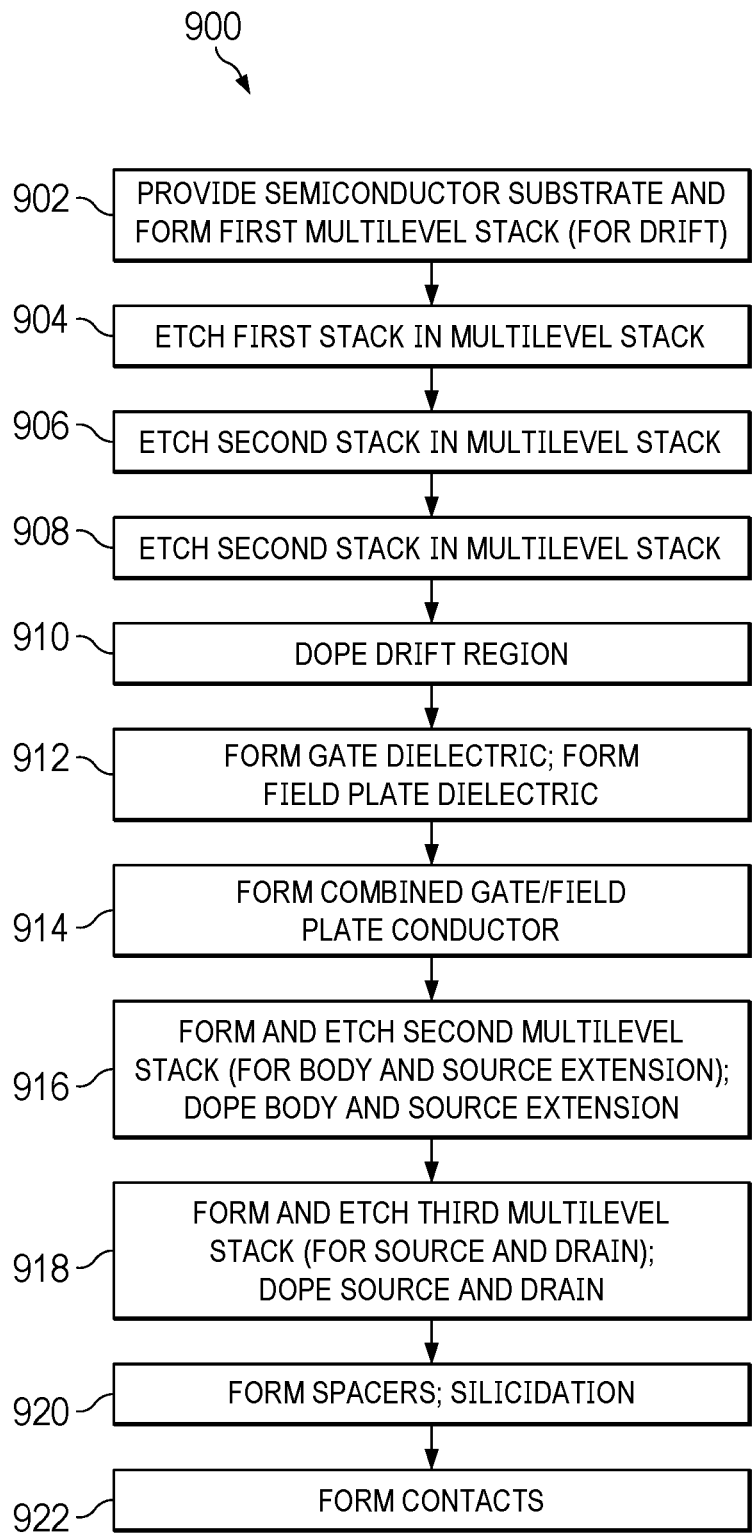
FIG. 9 is a flow diagram of an example method 900 for forming the folded DEMOS transistor.

Various examples are described with reference to views FIGS. 1A through 8, representing successive fabrication stages and resultant structures of an example semiconductor device, including portions folded DEMOS (or LDMOS) transistor 100, and FIG. 9 is a method 900, in flow chart form, that summarizes steps of those fabrication stages. The figures are not drawn to scale, are provided for illustration, and in some instances are simplified for context, while numerous specific details, relationships, and methods are set forth to provide an understanding of various examples. The present disclosure is not limited by the illustrated ordering of acts or events, as some acts may occur in different orders and/or concurrently with other acts or events. Further, not all illustrated acts or events are required to implement a methodology or construct a device in accordance with the present teachings.

Figure 1A:
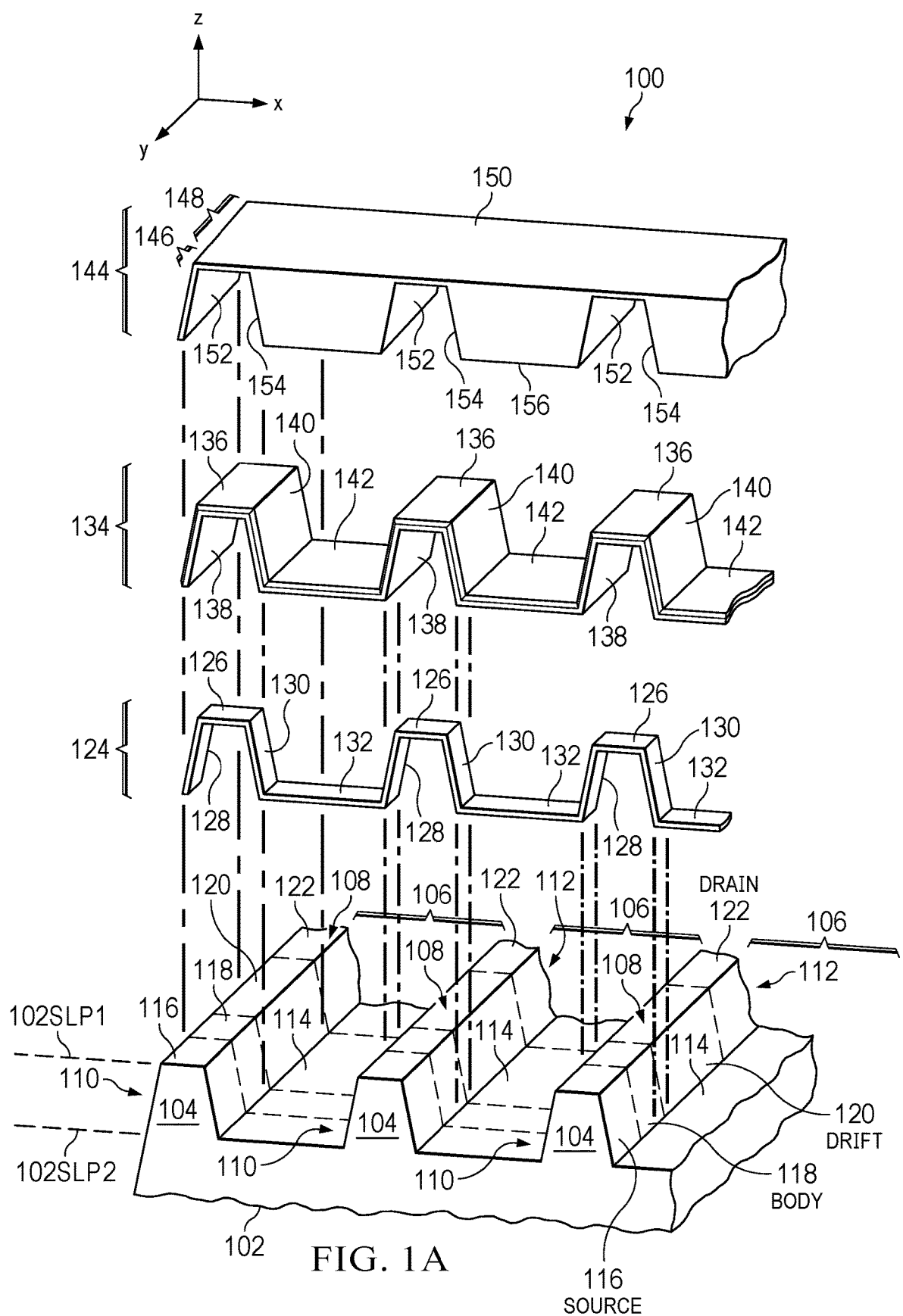
FIG. 1A is a perspective and partially exploded view of an example semiconductor device, including portions of a folded DEMOS transistor.

FIG. 1A is a perspective and partially exploded view of the folded DEMOS (or LDMOS) transistor 100. The exploded view of FIG. 1A is not intended to necessarily suggest that layers are separable as shown or are formed independently, as some materials may be derived from others, for example by growing or forming oxide structures from polycrystalline silicon, commonly referred to as polysilicon or poly. Instead, the illustration is to introduce certain structures, particularly as to three-dimensional complexities, and to facilitate an appreciation of additional aspects detailed below to adapt to and improve upon the three-dimensional structures. Further, the FIG. 1A perspective generally shows only structures and regions perceivable from a surface level, while later discussion and illustration demonstrate certain aspects that exist beneath the illustrated surfaces. Lastly, various other aspects of the folded DEMOS transistor 100 may be implemented by the above-incorporated U.S. Pat. No. 10,978,559, and the reader is referred to that patent.

The folded DEMOS transistor 100 is formed in and on a substrate 102, for example as part of a semiconductor wafer that includes other semiconductor devices, which may include planar transistors, including complementary metal-oxide semiconductor (CMOS) transistors (not shown). Accordingly, certain of the structures described herein may be constructed using, or as part of, conventional CMOS fabrication methods and devices. The substrate 102 may be implemented with a semiconductor material such as silicon, and the semiconductor material may have a first conductivity type, for example as p-type, or it may include a p-type region, such as a well or buried layer, in connection with the folded DEMOS transistor 100, which may be formed as a n-channel transistor. Complementary conductivity types are also contemplated. For sake of FIG. 1A and later figures, x-y-z coordinate directions are also illustrated, with the substrate 102 generally along the x-y plane. The directional references are for purposes of relative placement, but such terms are not intended to be restrictive as the device may be rotated in space and thereby change absolute, but not relative, references.

A plurality of corrugation members 104 extend from the substrate 102, in the z-dimension of the example. Each corrugation member 104 may be contemporaneously formed, for example by cutting trenches 106 through a first surface level plane 102SLP1 of the substrate 102 and down to a second surface level plane 102SLP2, whereby each corrugation member 104 protrudes away from the second surface level plane 102SLP2 and between adjacent trenches 106. Alternatively, each corrugation member 104 may be contemporaneously formed, for example by adding one or more layers, either selectively deposited or formed then etched, so that from the layers the remaining structures are the corrugation members 104 each extending away from the second surface level plane 102SLP2. Each corrugation member 104 includes an upper portion 108 and a first and second lateral portion 110 and 112 that provide respective sidewalls (non-coplanar to the upper portion 108) extending between the upper portion and 108 and the second surface level plane 102SLP2. Further, a lower surface portion 114 exists within each trench 106 and between each corrugation member 104 and along the second surface level plane 102SLP2. The lower surface portion 114 may have a width, between adjacent trenches 106 and in the x-dimension, that is typically 40 percent to 100 percent of the depth of each of the trenches 106 and can be smaller relatively if the trench depth is further scaled as anticipated, althrough FIG. 1A (and later Figures) is not drawn to this scale, so as to expand the illustration. For example, this width in current mature power technology, may be in a range from 100 to 400 nm. As technology advances, such numbers also may be altered, scaling smaller and/or deeper for example with industry advancement and scaling, whereby the depth may be in a range from 400 to 10,000 nm. Each lower surface portion 114 is depicted as flat, but may in fact be rounded due to non-uniformity in removal of the semiconductor material to form the trenches 106. The first and second lateral portions 110 and 112 may be angled, for example at 84 degrees to 88 degrees from the x-y plane.

FIG. 1A also illustrates areas, using dashed lines along surfaces of the corrugation members 104 and lower surface portions 114, where various transistor conductive path regions are generally formed or are to be formed along at least the surface, and can extend below the surface to different extents, of the folded DEMOS transistor 100. These regions generally include a source 116, a body 118, a drift region 120, and a drain 122. Each of these regions extends along all of the corrugation members 104, so both in the x-dimension across each upper portion 108 and across each lower surface portion 114, and along the z-dimension across each of the first lateral portion 110 and the second lateral portion 112. Accordingly, the total width of each region is the aggregate distance across both the x- and z-dimensions. Additionally, for simplification sake, FIG. 1A (and other figures) illustrates only one set of these regions; however, in implementation, the regions may repeat in sets, or be symmetric per each corrugation member 104, for example in FIG. 1A in the negative y-dimension there may be an additional drift region beyond the illustrated drain 122, and then beyond that additional drift region, a body, then source, and so forth.

FIG. 1A also illustrates, in the exploded view above the substrate 102 and its corrugation member 104, a gate dielectric 124. Generally, the gate dielectric 124 is formed to align with a portion of the body 118, including across the corrugation members 104 and the lower surface portions 114, so the gate dielectric 124 includes corresponding upper portions 126 (to align with a part of the upper portion 108 of the body 118), first and second lateral portions 128 and 130 (to align with respective parts of the first and second lateral portions 110 and 112 that align with portions of the body 118), and lower surface portions 132 (to align with the part of the lower surface portion 114 that aligns with portions of the body 118). The gate dielectric layer 124 may be formed by a thermal oxidation process, and is relatively thin, for example 3 to 20 nm thick.

FIG. 1A also illustrates, in the exploded view above the substrate 102 and displaced in the negative y-dimension relative to the gate dielectric 124, a field plate dielectric 134. Generally, the field plate dielectric 134 is formed to align with a portion of the drift region 120, including where the drift region 120 extends across the corrugation members 104 and the lower surface portions 114, and the field plate dielectric 134 may abut, taper down toward, or partially overlie a portion of the gate dielectric 124. The field plate dielectric 134 also includes corresponding upper portions 136, first and second lateral portions 138 and 140, and lower surface portions 142, with each to align to corresponding surfaces of the drift region 120 (upper portion 108, first and second lateral portions 110 and 112, and lower surface portions 114, respectively). The field plate dielectric layer 134 also may be formed by a thermal oxidation process with one or more layers and is to be thicker than the gate dielectric layer 124, so that for example the field plate dielectric layer 134 may be, for example, 35 to 80 nm thick.

FIG. 1A also illustrates, in the exploded view above the substrate 102 and above both the gate dielectric 124 and the field plate dielectric 134, a combined gate/field plate conductor 144. The combined gate/field plate conductor 144 is so named because it serves as a gate in the proximity of the gate dielectric 124 and as a field plate in the proximity of the field plate dielectric 134. The combined gate/field plate conductor 144 is formed to align with both the gate dielectric 124 and the field plate dielectric 134, so it includes a first portion 146 that overlies the thinner gate dielectric 124 and a second portion 148 that overlies the thicker field plate dielectric 134. Further, the combined gate/field plate conductor 144 also extends along the same shape as the corrugation members 104 and the lower surface portions 114, so it includes a corresponding upper portion 150, first and second lateral portions 152 and 154, and a lower surface portion 156. The combined gate/field plate conductor 144 may be formed, as examples, from either a metal or doped polysilicon. Further, if the trenches 106 are sufficiently narrow and the material used to form the combined gate/field plate conductor 144 relatively thick, then it is possible the material could completely fill the trenches 106 in which case the upper topology may be closer to, or actually, continuously planar in the x-dimension.

Figure 1B:
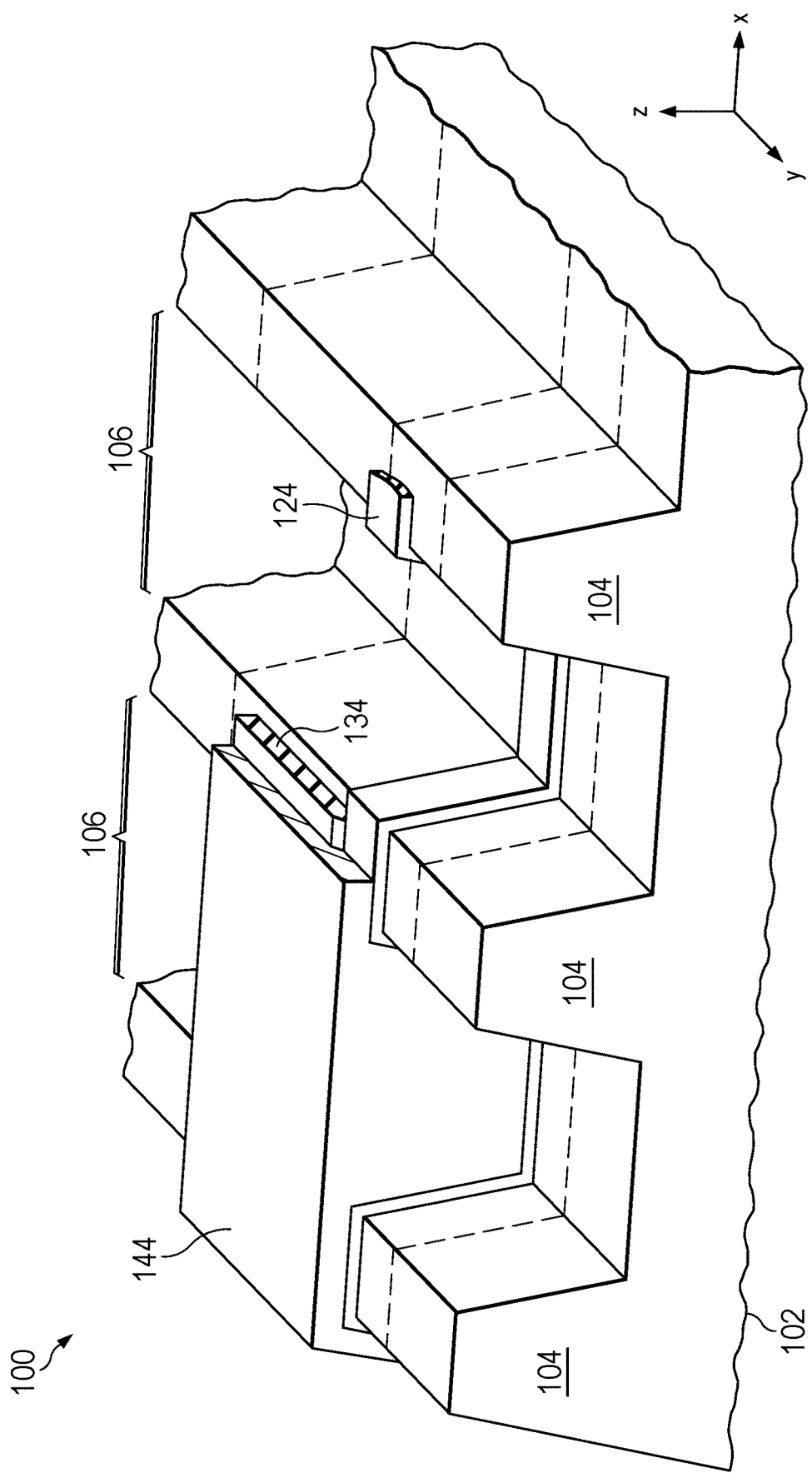
FIG. 1B illustrates the FIG. 1A folded DEMOS transistor in an assembled and partially cutaway view.

FIG. 1B illustrates the FIG. 1A folded DEMOS transistor 100 in an assembled and partially cutaway view. In the assembled view, the aggregate width of each of the source 116, the body 118, the drift region 120, and the drain 122 may be further appreciated as following along the contours of the corrugated structure, generally in the x-dimension. However, the corrugations also give rise to additional complexities, addressed in examples below. Such complexities involve certain of the contours presented by the corrugated structure, and others also include consideration of other devices on or in the substrate that may be formed using one or more concurrent steps, that is, sharing a process step(s), with the folded DEMOS transistor 100.

Figure 1C:
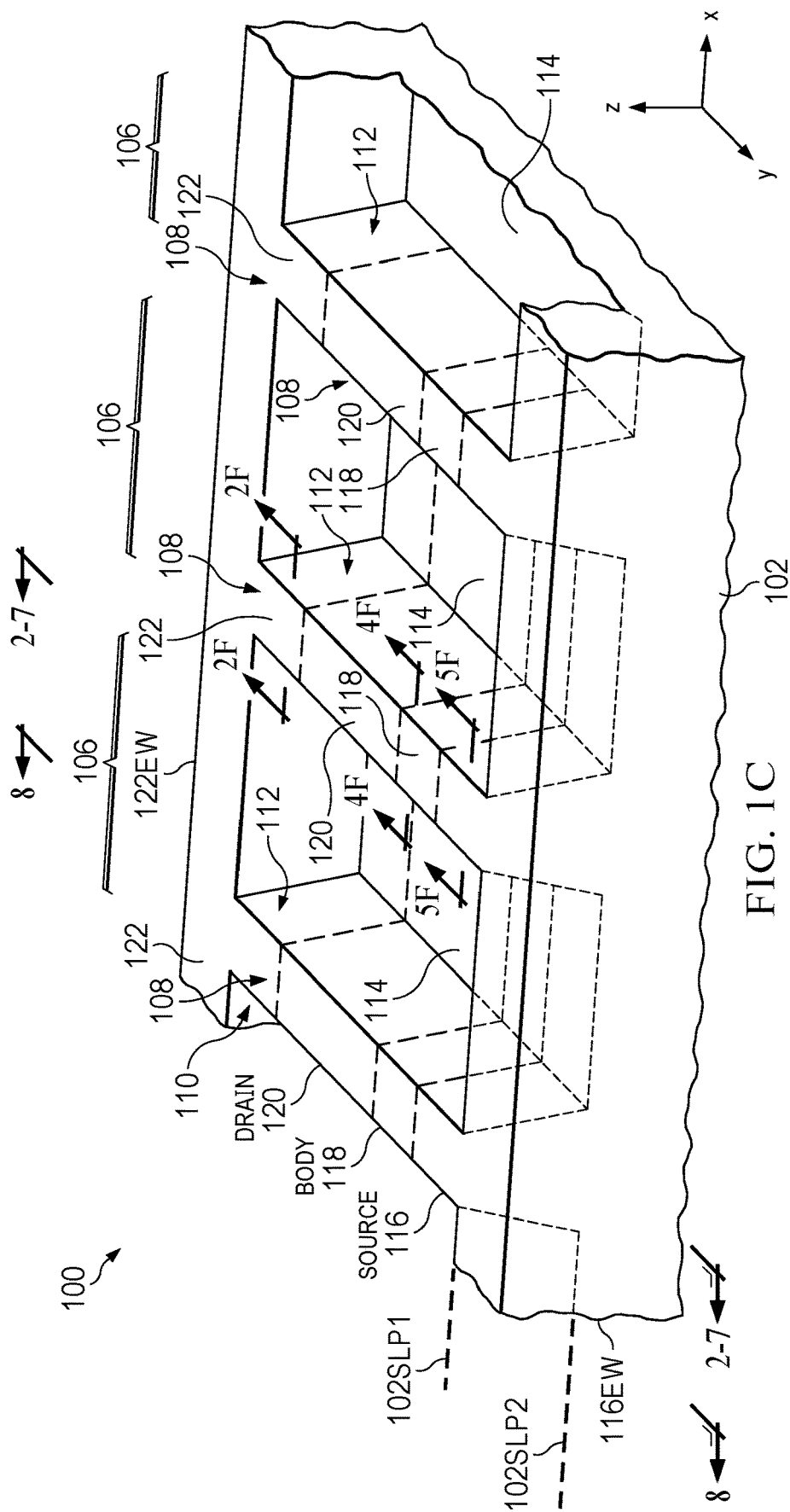
FIG. 1C is a perspective and partial view of additional area in connection with the FIG. 1A folded DEMOS transistor.

FIG. 1C is a perspective and partial view of additional area in connection with the FIG. 1A folded DEMOS transistor 100. In FIG. 1C, the end of each of the corrugation members 104 that includes the source 116 extends in the y-dimension to a source endwall 116EW, and comparably the end of each of each of the corrugation members 104 that includes the drain 122 extends in the y-dimension to a drain endwall 122EW. The top surface of each of the source endwall 116EW and the drain endwall 122EW is along the first surface level plane 102SLP1, that is, coplanar with the top surface of the corrugation members 104. Accordingly, the FIG. 1C perspective depicts that the trenches 106 may be formed in the substrate 102, in the negative z-dimension and from the first surface level plane 102SLP1, so that the untrenched areas provide the corrugation members 104 and the source endwall 116EW and the drain endwall 122EW. The FIG. 1C perspective also provides a reference for various cross-sectional illustrations shown in the FIGS. 2A through 8, as described below.

Figure 2A:
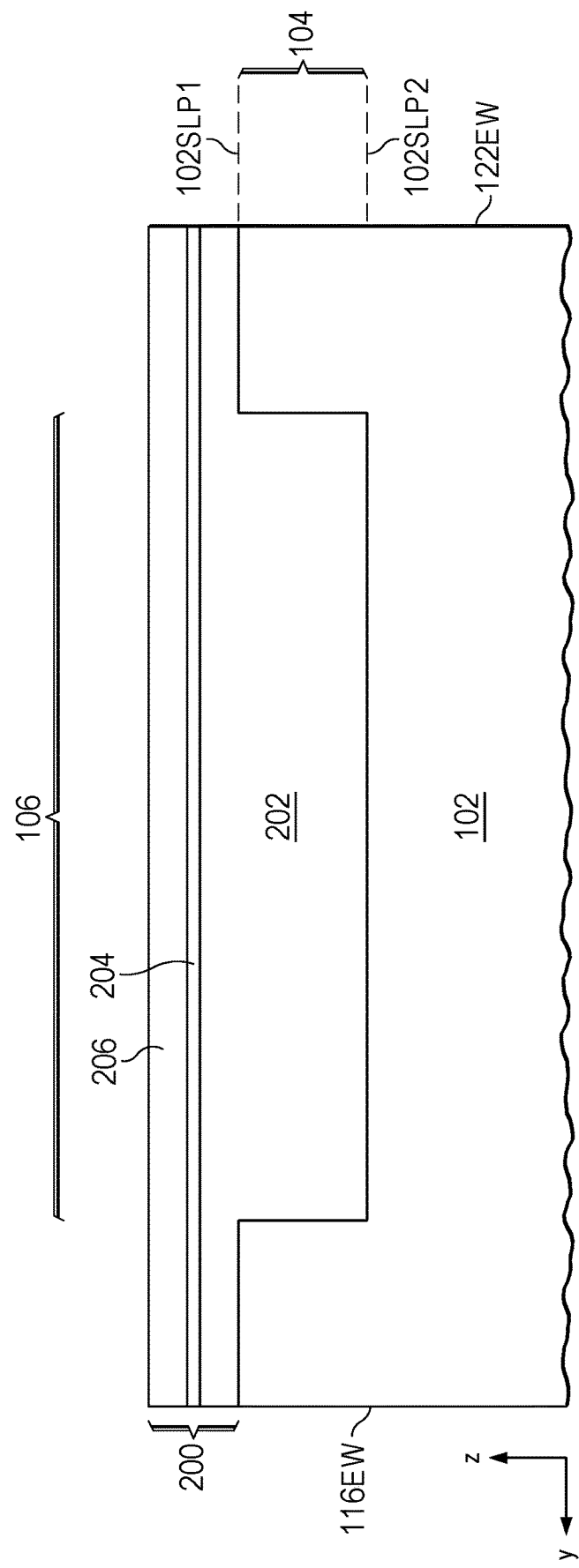
FIG. 2A is a cross-section view of the FIG. 1C folded DEMOS transistor at a relatively early fabrication stage.

FIG. 2A is a cross-section view of the FIG. 1C folded DEMOS transistor 100 at a relatively early fabrication stage, across the major axis of the trench 106 once that trench 106 has been formed. Additionally, while not yet doped to form conductive regions as described later, the source endwall 116EW is located at the far left edge of the structure and the drain endwall 122EW is at the far right edge of the structure, each extending in the z-dimension away from the second surface level plane 102SLP2 to the first surface level plane 102SLP1. In FIG. 2A (and FIG. 9 method step 902), a multi-layer stack 200, which in an example includes at least three layers, is formed along exposed surface of the substrate 102, and thereby extends along upper surfaces of the source endwall 116EW and the drain endwall 122EW, as well as within the trench 106. In an example, a first stack layer 202, closest to the substrate 102, is a hard mask material, such as silicon nitride or silicon oxynitride. The first stack layer 202 may be formed by chemical vapor deposition (CVD), atomic layer deposition (ALD), or other techniques with a thickness from 10 to 100 nm. A second stack layer 204, adjacent, and abutting in an example, the first stack layer 202, is a pattern transfer material, such as an oxide. The second stack layer 204 may be formed by CVD, plasma enhanced CVD (PECVD), ALD, or other techniques, with a thickness from 10 to 100 nm. A third stack layer 206, adjacent, and abutting in an example, the second stack layer 204, is a pattern receiving material, such as a photoresist. The third stack layer 206 may be formed by spinning a photoresist onto the exposed structure and accordingly over the second stack layer 204, the third stack layer 206 with a thickness from 100 to 1,000 nm.

Figure 2B:
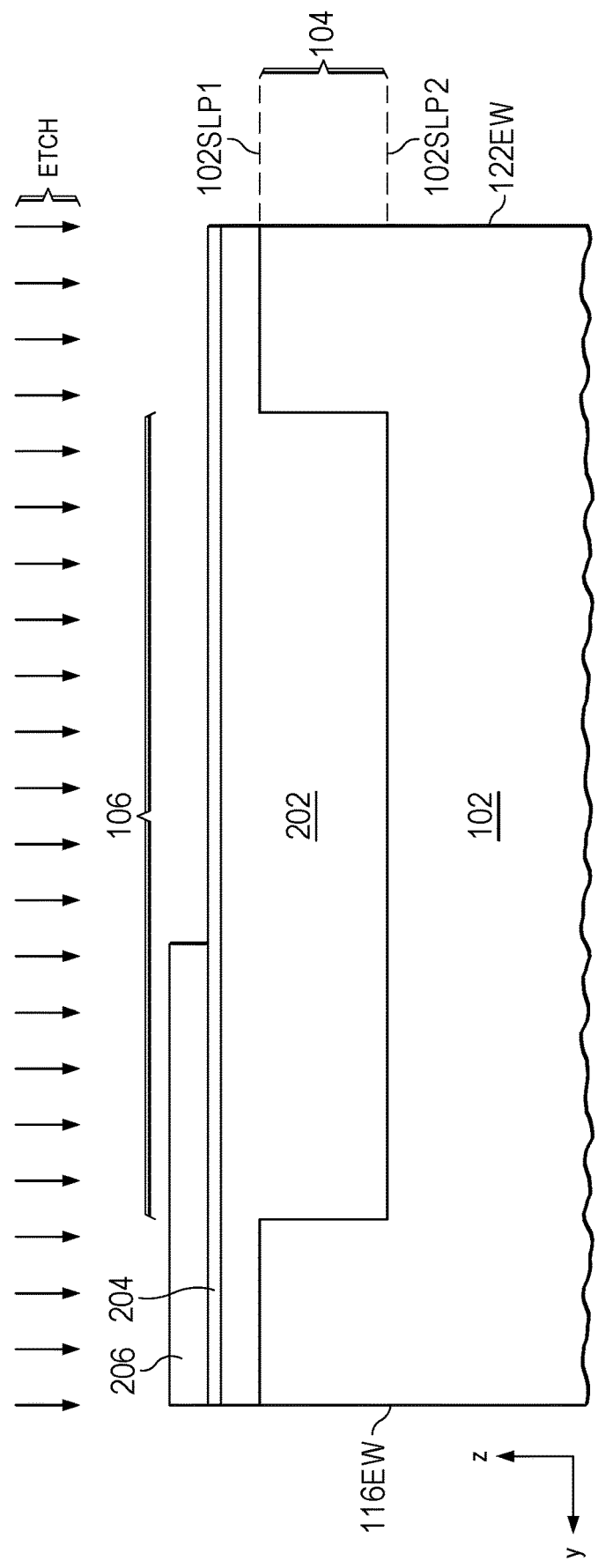
FIGS. 2B through 2E are successive views of FIG. 2A, illustrating additional fabrication steps and the formation of a transistor drift region.

FIG. 2B is a view of FIG. 2A, after additional fabrication. In FIG. 2B (and FIG. 9 method step 904), a portion of the third stack layer 206 is removed, shown generally by an etch and corresponding arrows, with it understood for this etch and others, the etch mechanism can be applied to an entire area, with only selected materials or areas impacted by the etch. For example, when the third stack layer 206 is photoresist, the photoresist is first exposed to light in selective areas, for example from a photolithographic light source, such as ultraviolet light, passed through a reticle that has a pattern to selectively pass the light. For a positive photoresist material, the areas exposed to light change in character, for example in solubility, after which the changed material is removed, for example with a solvent, while the unexposed portion(s) of the photoresist remain. A negative photoresist material also may be used, with light exposed areas becoming less soluble, after which the unexposed areas are removed.

Figure 2C:
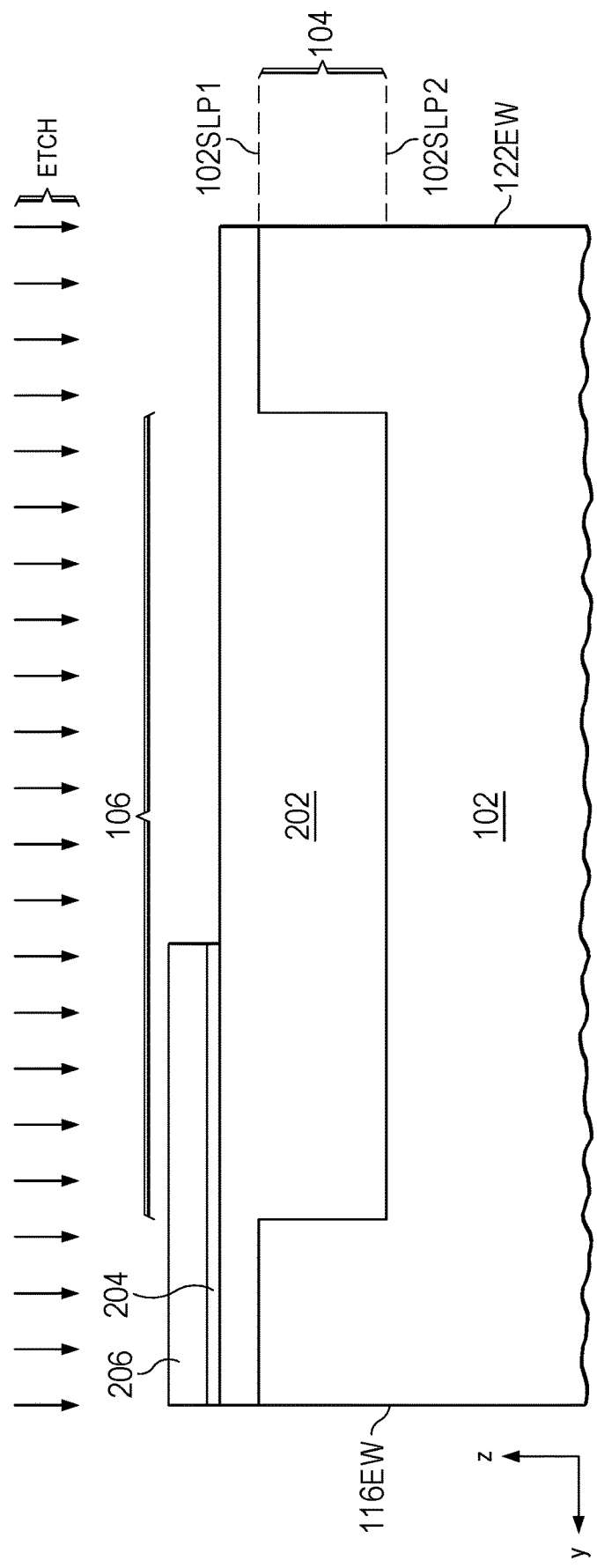

FIG. 2C is a view of FIG. 2B, after additional fabrication. In FIG. 2B (and FIG. 9 method step 906), a portion of the second stack layer 204 is removed, shown generally by an etch and corresponding arrows, where the etch occurs in areas unmasked by the remaining portion of the third stack layer 206. For example, when the second stack layer 204 is oxide, unmasked portions of the oxide are removed by dilute or buffered hydrofluoric acid (HF) immersion or a selective plasma etching process.

Figure 2D:
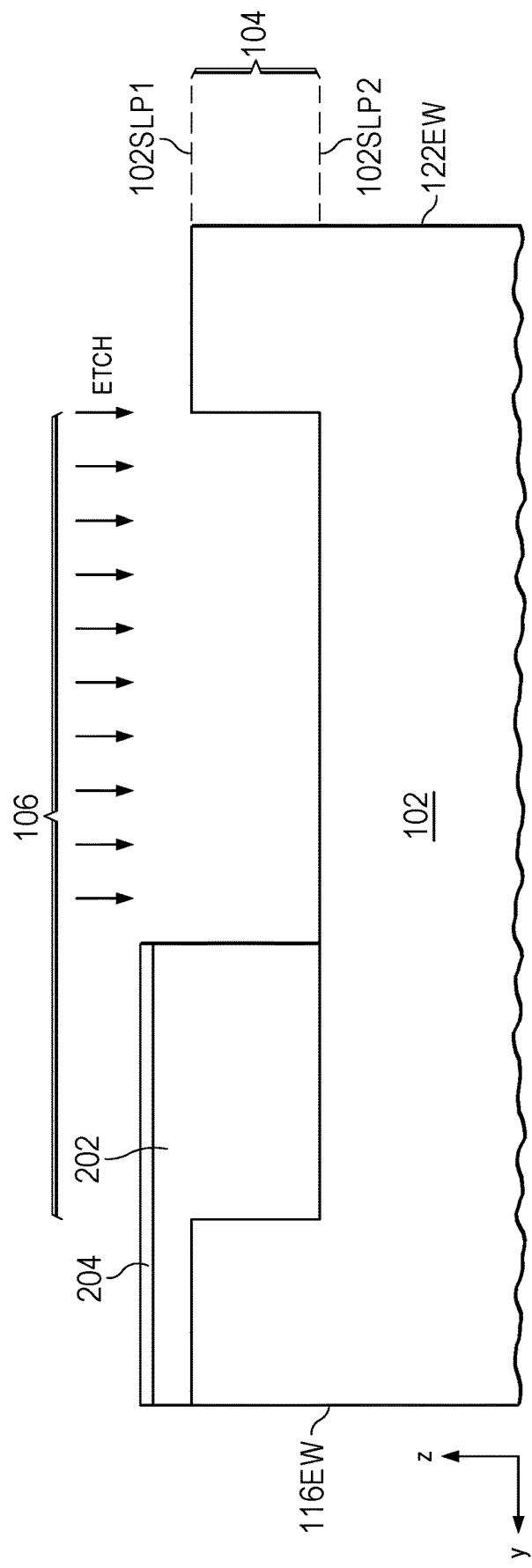

FIG. 2D is a view of FIG. 2C, after additional fabrication. In FIG. 2C (and FIG. 9 method step 908), the remaining portion of the FIG. 2C third stack layer 206 is removed. Thereafter, a selective portion of the first stack layer 202 is removed, shown generally by an etch and corresponding arrows, where the etch occurs in areas unmasked by the remaining portion of the second stack layer 204. Accordingly, the pattern previously formed in the second stack layer 204 (pattern transferring layer) is essentially transferred to the first stack layer 202 (pattern receiving layer), where the pattern is prepared also for the substrate 102 in that any removed portion of the first stack layer 202 thereby exposes a corresponding portion of the substrate 102. When the first stack layer 202 is silicon nitride, unmasked portions of the substrate 102 are removed by either a wet etch that the second stack layer 204 (pattern transferring) is resistant to, or a selective plasma etch with selectivity to the first stack layer 202 acting as a hard mask.

Figure 2E:
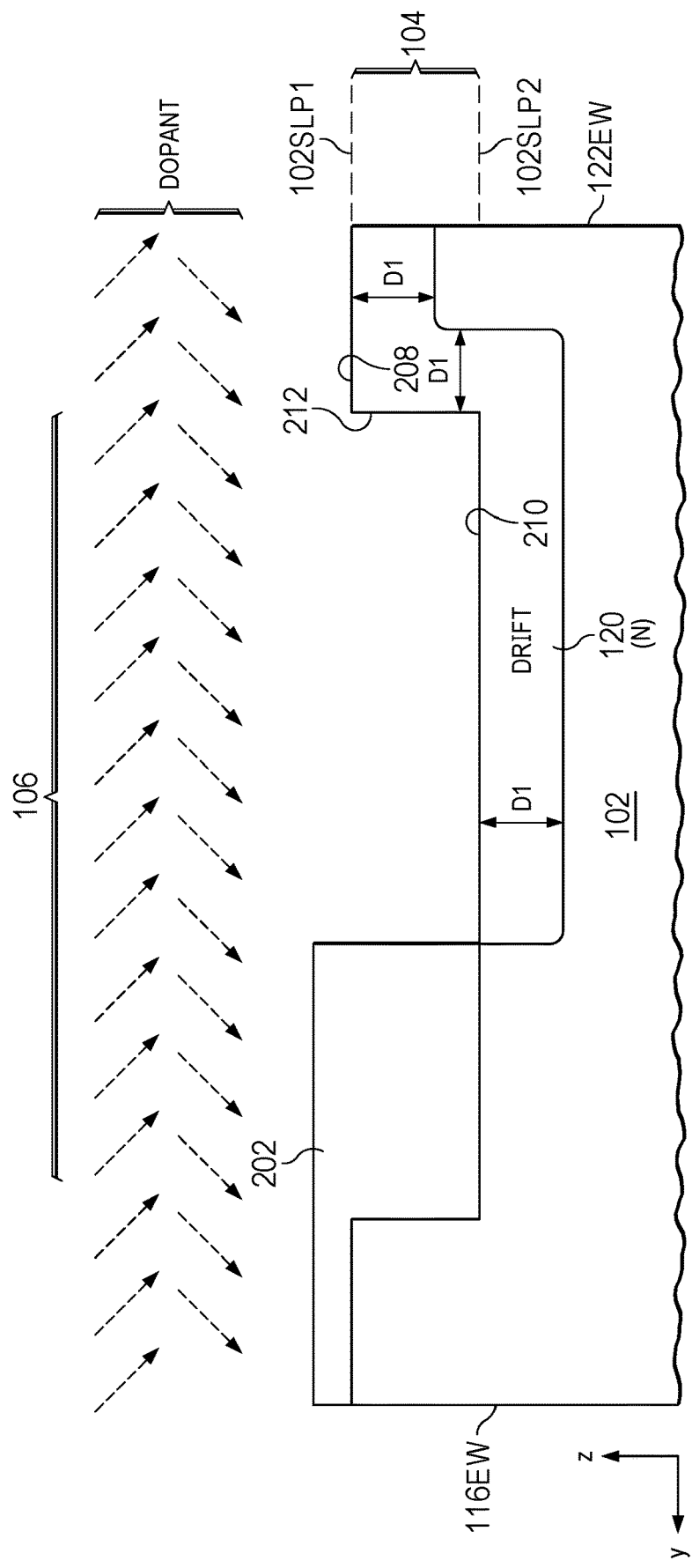

FIG. 2E is a view of FIG. 2D, after additional fabrication. The remaining portion of the FIG. 2D second stack layer 204 is removed, leaving the unetched portion of the first stack layer 202 as a hard mask. Thereafter in FIG. 2E (and FIG. 9 method step 910), a selective portion of the substrate 102 is doped, shown generally by dopants and corresponding arrows, where the doping occurs in areas unmasked by the hard mask remaining portion of the first second stack layer 202. Also in this regard, in an example application the dopants are conformally provided, that is, imparted into the substrate 102 in a manner with a relatively conformal (uniform) distribution to each surface into which the dopants are introduced. The dopants can be placed by implantation, or epitaxial growth, or deposition, or plating processes, and concurrently/subsequently diffused into the underlying material. Accordingly, the FIG. 2E dopants achieve an anisotropic dopant profile, that is normal to the local surface, in which the dopant concentration is generally at least similar or the same, relative to each surface into which the dopant is introduced, and further provides a similar or same dopant concentration extending inward into the volume of the semiconductor material that includes that surface, for the initial concentrations, with differences at longer distances due to the corrugations, that is, closer to the inner and outer corners created from the corrugated shape. For example, plasma doping (PLAD) may be used to obtain a more uniform dopant implant concentration into and beyond the exposed surfaces and from different angles. As another example, ALD or molecular layer deposition (MLD) also may be used. These deposition techniques form a very thin (e.g., single atom) conformal film or layer across all exposed surfaces, by inserting multiple gaseous species, called precursors or reactants, into the layer and with sufficient time to adsorb, one specie at a time and at temperatures below the dopant diffusion temperature, alternating in species and concentrations of precursors to build multiple layers to achieve thicknesses and concentrations as desired. The layer formation and subsequent dopant transfer into the substrate may be assisted with other processes, for example using heat so that once all precursors are added to the layer, and multiple layers are so formed, an anneal is performed which causes the desired dopant precursors from the film(s) to diffuse, relatively uniformly from all film-covered surfaces, into the silicon. Other assist mechanisms include plasma or light (ultraviolet). Accordingly in FIG. 2E, the dopants are shown to provide a drift region 120 in a portion of the trench 106 (and the drain endwall 122EW). The drift region 120 generally has a nominal depth D1 extending (e.g., normally) from each surface into which the dopants are introduced, including in FIG. 2E a first x-y plane surface 208 at the first surface level plane 102SLP1 and a second x-y plane surface 210 at the second surface level plane 102SLP2, as well as in a first x-z plane surface 212 along one end of the trench 106 at which the drain endwall 122EW extends in the z-dimension away from the second surface level plane 102SLP2. Additionally as detailed later with respect to FIG. 2F, the diffusing length may depart from D1 in locations at or near structural corners.

Figure 2F:
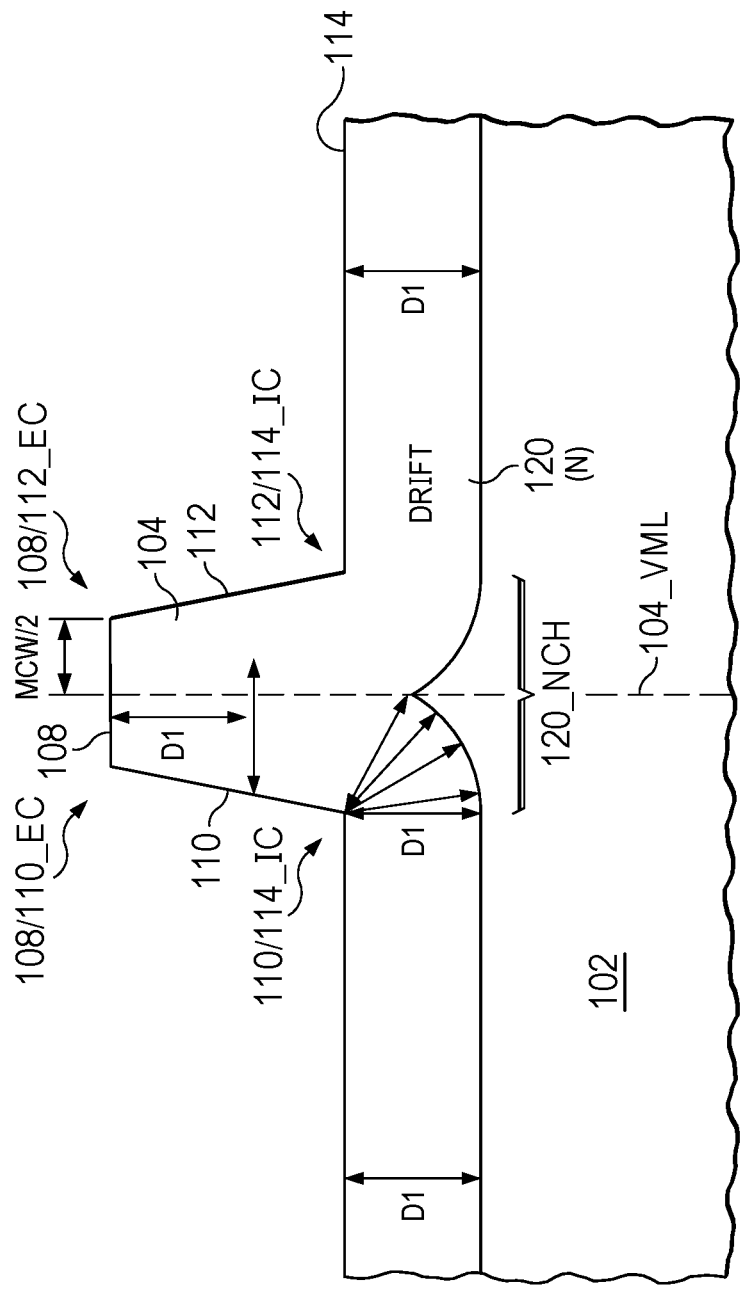
FIG. 2F is a view after the fabrication steps shown completed in FIG. 2E, but with the view taken along the drift portion and perpendicular to the majority length of a corrugation member.

FIG. 2F is a view after the fabrication steps shown completed in FIG. 2E, but with the view taken along the drift portion 120 and perpendicular to the majority length of the corrugation member 104. Accordingly, the FIG. 2F view is perpendicular from and shifted along the x-axis relative to, the FIG. 2E illustration. The FIG. 2F view generally shows the drift region 120 in the entirety of the corrugation member 104, because the depth D1 is greater than half the minimum width of the corrugation member 104 (that half width shown as MCW/2, which may be in the range of 40-400 nm), so that dopant diffusion from the upper portion 108 collides (and merges) with dopants diffused in a normal direction from both the first and second lateral portions 110 and 112, as those latter dopants extend inward toward a vertical mid-line (VML) 104_VML that vertically bisects the corrugation member 104. Additionally, also within the corrugation member 104, but beyond the distance D1 from the upper surface 108, there is still the possibility of dopant collision from dopants entering from the opposing surfaces of the first and second lateral portions 110 and 112. Away from the corrugation member 104, the dopants also generally extend the distance D1 below the lower surface portion 114 that exists within the trench 106, as shown in the negative z-dimension downward from the lower surface portion 114. Accordingly, if D1 is greater than the distance from either the first and second lateral portion 110 and 112 to the VML 104_VML, then the dopant profile and the doping length toward the VML 104_VML may be influenced, and depart from D1, by dopants from multiple surfaces, such as two or three of the upper portion 108, the first lateral portion 110, and the second lateral portion 112. Additionally, the dopant concentration and length can depart from D1 due to effects at the edges that form an interface between two adjacent surfaces. For example, an exterior corner 108/110_EC occurs at the interface between the surface edge of the upper portion 108 and the surface edge of the first lateral portion 110, so nearer to that interface, respective dopants received at each of those surfaces collide within the doped material and impact the achieved concentration and doping length. Additionally, the dopant distribution below the surface can be affected by the structure that creates the discontinuity between those surfaces, where that structure in FIG. 2F is the exterior corner 108/110_EC, which itself may be formed where two surfaces (e.g., planes) intersect as planes at a defined angle, or one or both of the surfaces may have non-planar portions (e.g., curved) where the surfaces interface, forming a curved radius as the structure between the surfaces. A similar observation may be made with respect to an exterior corner 108/112_EC, in the area of which dopants collide from diffusions into both the upper surface 108 and the second lateral portion 112. Also relatedly, the two different surfaces provided respectively by the first lateral portion 110 and the lower surface portion 114 have respective edges that interface at an interior corner 110/114_IC, as do the second lateral portion 112 and the lower surface portion 114 at an interior corner 112/114_IC. Accordingly, in the volume of the substrate 120 near or inwardly from each interior corner 110/114_IC and 112/114_IC, the respective dopants received from each of the adjacent surfaces diffuse primarily normal to each respective surface, so within the doped material the diffusion length departs from D1 and the concentration diminishes differently in the area of, and due to, the corner. Indeed, because of the limited reach and greater area/volume reachable by dopants diffused from or near the interior corners 110/114_IC and 112/114_IC in the direction toward the VML 104_VML, the dopants may have a reach less than D1 and form a profile with a notch 120_NCH, toward the VML 104_VML. Accordingly, for the volume of semiconductor material in selected locations reached by D1 from only one surface (e.g., in the negative z-dimension below portions of the lower surface portion 114) reached by the depth D1 in FIG. 2F, the dopant profile is the same or similar, whereas if a same volume location is reachable by dopants from plural surfaces due to an exterior corner (from connecting planes or along a convex curve) the dopant length may be longer than D1, while if a volume is located proximate an interior corner (from interfacing non-coplanar planes or along a concave curve) the dopant length may be shorter than D1, as the fluence of the diffusion is diluted by the incrementally larger surface of the radius.

Also in the illustrated example in which an n-type drift region 120 is desired (ultimately to support an NMOS type device), the FIGS. 2E and 2F dopants may be phosphorous and/or arsenic, applied with appropriate attributes to achieve an average dopant concentration in that volume of $1e12/cm^3$ to $1e14/cm^3$. After the drift region 120 is formed, the remaining portion of the first stack layer 202 is removed. Prior to that removal, note that portion of the first stack layer 202 provides a hard mask in the sense of blocking dopants to unexposed area of the substrate 102, and it also provides additional precision in the doping, based on its inclusion in the multi-layer stack 200 (FIG. 2A). For example, were a dopant implant attempted without the multi-layer stack and using a photoresist mask, there may be geometric limitations, particularly due to the topography of the corrugation members 104. For instance, the height of the corrugation members 104, as extending from the second surface level plane 102SLP2, would cause shadowing of the other surfaces from a typical "beamline" implant, which in turn would compromise the conformity of a subsequent dopant implant. In contrast, the multi-layer stack 200 facilitates transfer of the desired pattern between layers of that stack, ultimately providing the hard mask portion of the first stack layer 202 and the more conformal masking for doping it provides.

Figure 3A:
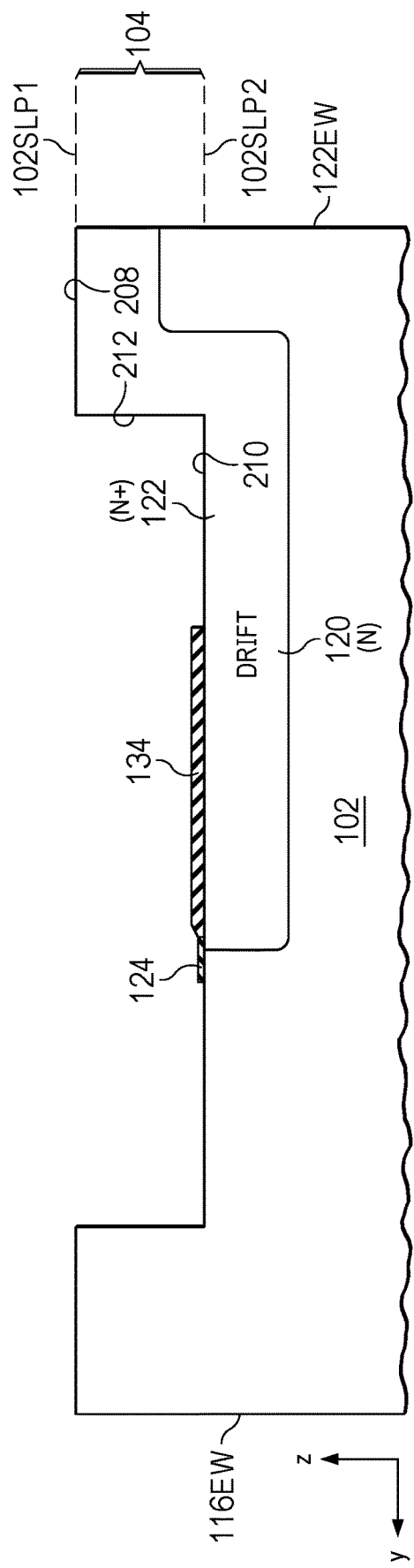
FIGS. 3A through 3B are successive views of FIG. 2E, illustrating additional fabrication steps and the formation of a transistor gate.

FIG. 3A is a view of FIG. 2E, after additional fabrication. In FIG. 3A (and FIG. 9 method step 912), the gate dielectric 124 is formed adjacent a portion of the exposed surface of the substrate. FIG. 3A illustrates that portion of the gate dielectric 124 as formed along the second surface level plane 102SLP2 within the trench 106, althrough FIG. 1A illustrates that the gate dielectric 124 is likewise formed along the corrugation members 104, thereby further including first and second lateral portions 128 and 130 in the y-z plane and an upper portion 126 in the x-y plane and aligned with the first surface level plane 102SLP1. Additionally, part of the gate dielectric 124 abuts the drift region 120, while another part extends away from the drift region 120 (in the y-dimension in FIG. 3A), so as to abut what will later be formed as part of the body 118. Also in FIG. 3A (and included in method step 912), the field plate dielectric 134 is formed to abut a portion of the drift region 120, and also as shown in FIG. 1A, the field plate dielectric 134 is likewise formed along the corrugation members 104, thereby further including first and second lateral portions 138 and 140 in the y-z plane and an upper portion 136 in the x-y plane and aligned with the first surface level plane 102SLP1. Each of the gate dielectric 124 and the field plate dielectric 134 may be formed by various techniques, with the field plate dielectric 134 having a greater thickness than the gate dielectric 124.

Figure 3B:
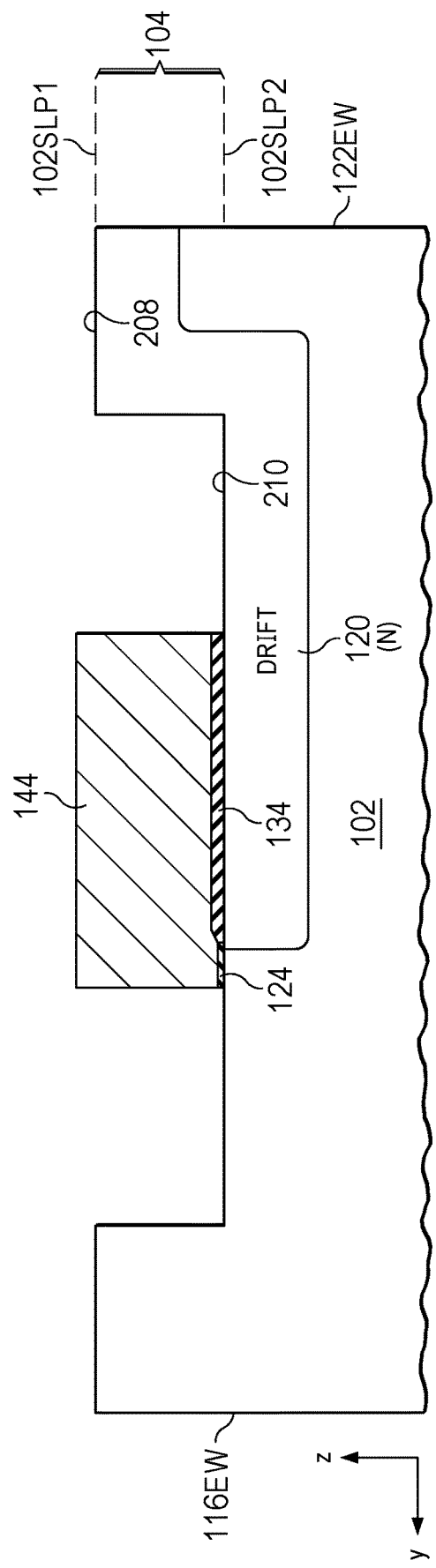

FIG. 3B is a view of FIG. 3A, after additional fabrication. In FIG. 3B (and FIG. 9 method step 914), the combined gate/field plate conductor 144 is formed over both the gate dielectric 124 and the field plate dielectric 134. The gate/field plate conductor 144 may be formed, for example, by depositing a polysilicon layer that is then masked and etched to create the boundaries shown in FIG. 3B and FIG. 1A. The polysilicon layer may have a thickness in the range of 600 to 1,000 nm and its upper surface is planarized. Further, as shown in FIG. 1A, the gate/field plate conductor 144 is likewise formed along the corrugation members 104, thereby further including first and second lateral portions 152 and 154 in the y-z plane and an upper portion 150 in the x-y plane and aligned with the first surface level plane 102SLP1.

Figure 4A:
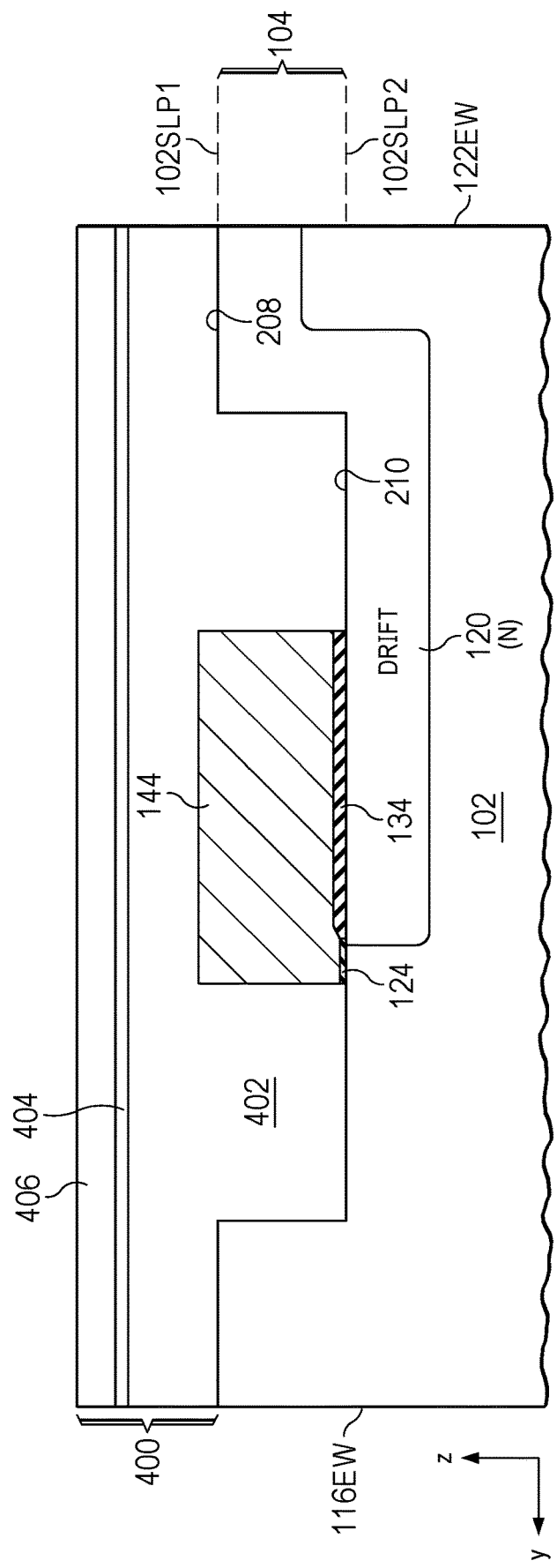
FIGS. 4A through 4E are successive views of FIG. 3B, illustrating additional fabrication steps and the formation of a transistor body.

FIG. 4A is a view of FIG. 3B, after additional fabrication and beginning a sequence comparable in many respects to that in FIG. 2A through 2E, but now more directed to the formation of the body 118 (and summarized in method step 916). Particularly, a multi-layer stack 400, which in an example includes at least three layers, is again formed along exposed surface of the substrate 102 and may include the same respective materials as the FIG. 2A multi-layer stack 200. Accordingly, FIG. 4A illustrates, in the multi-layer stack 400, a first stack layer 402, closest to the substrate 102 and with a hard mask material, a second stack layer 404, adjacent, and abutting in an example, the first stack layer 402, as a pattern transfer material, and a third stack layer 406, adjacent, and abutting in an example, the second stack layer 404, as a pattern receiving material. The materials and manners of forming them may be the same as earlier described with respect to the multi-layer stack 400.

Figure 4B:
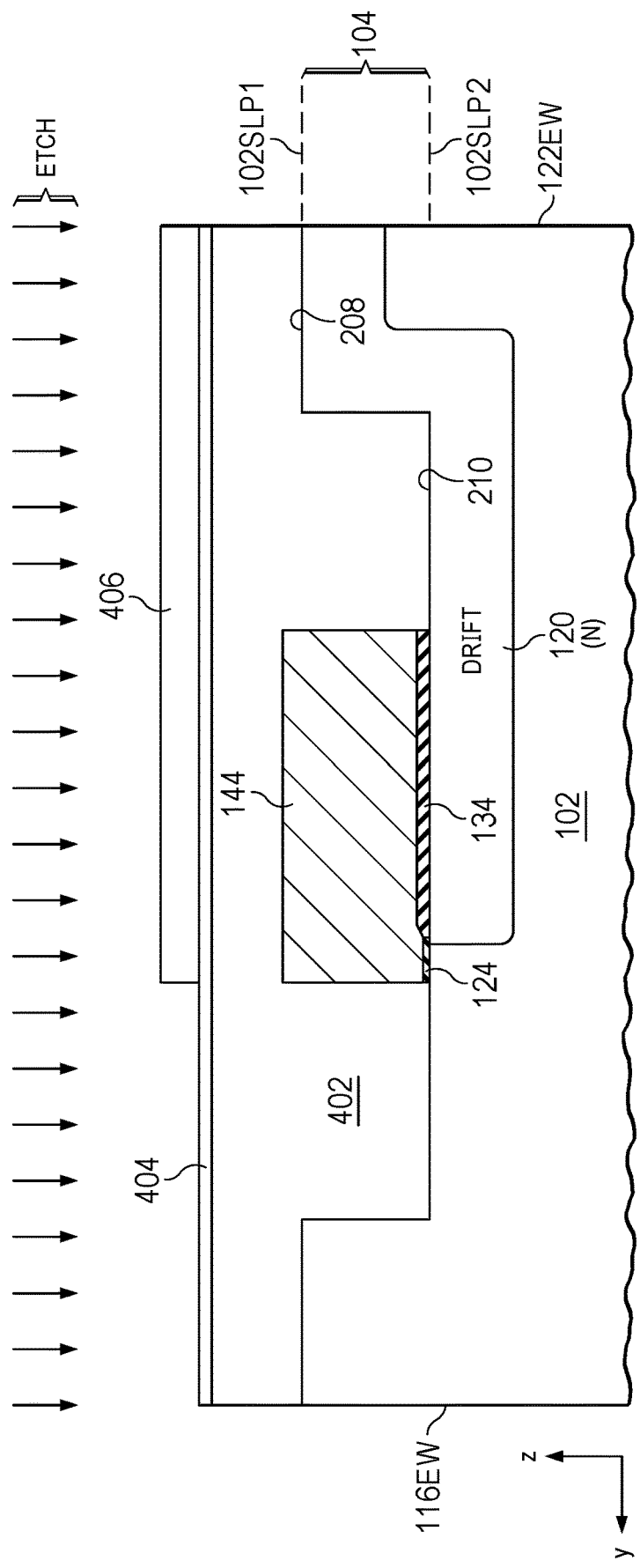
Figure 4C:
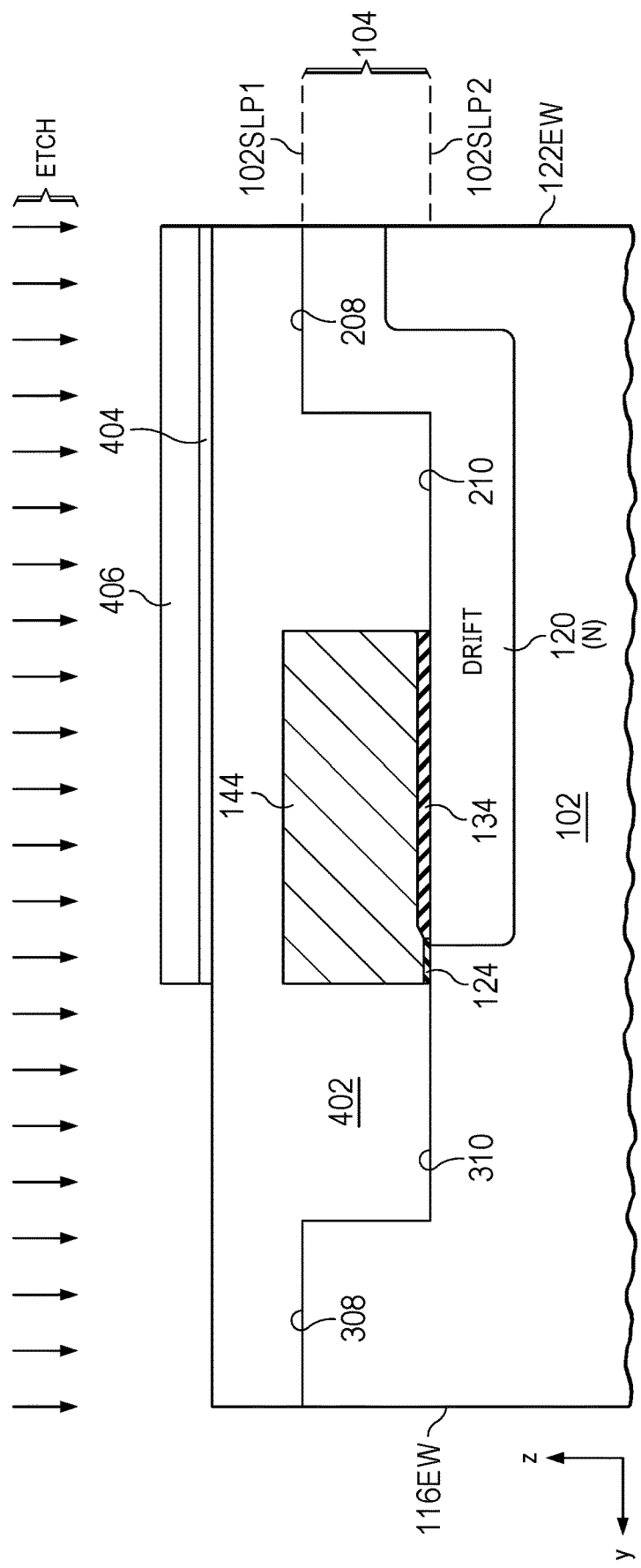
Figure 4D:
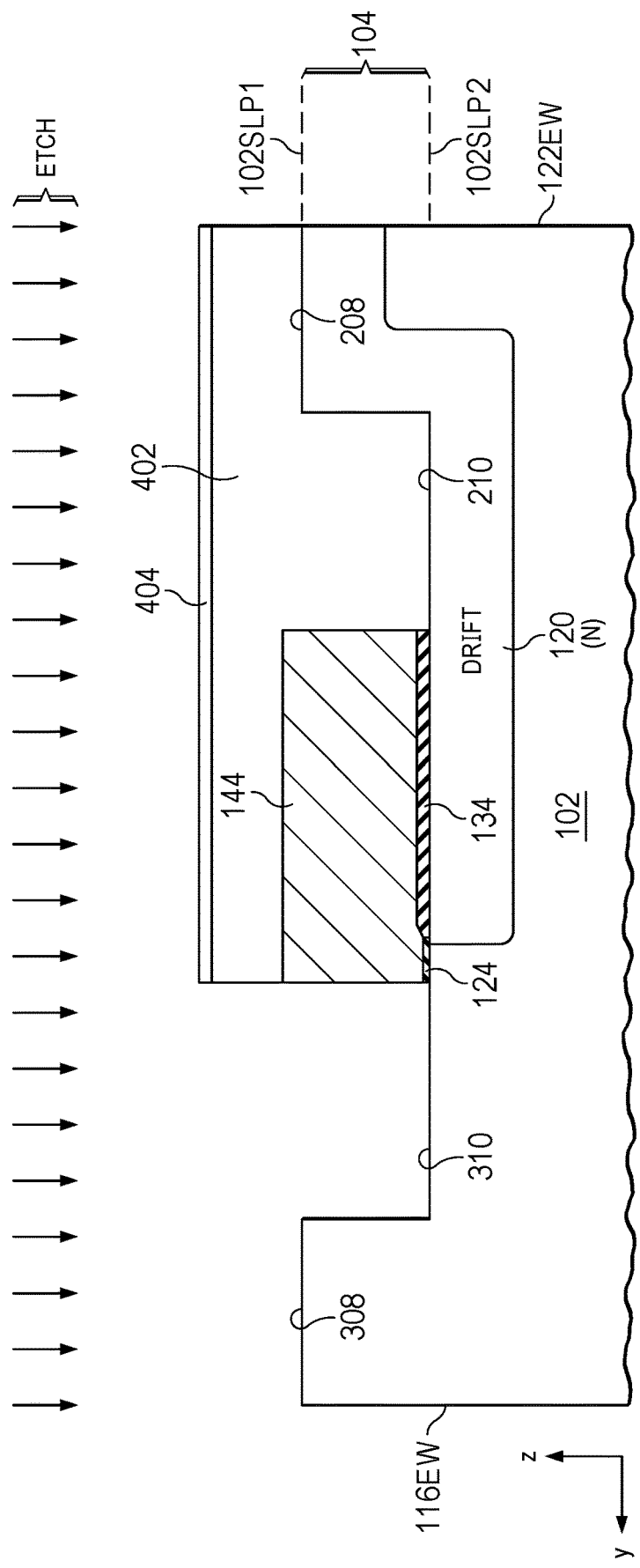
Figure 4E:
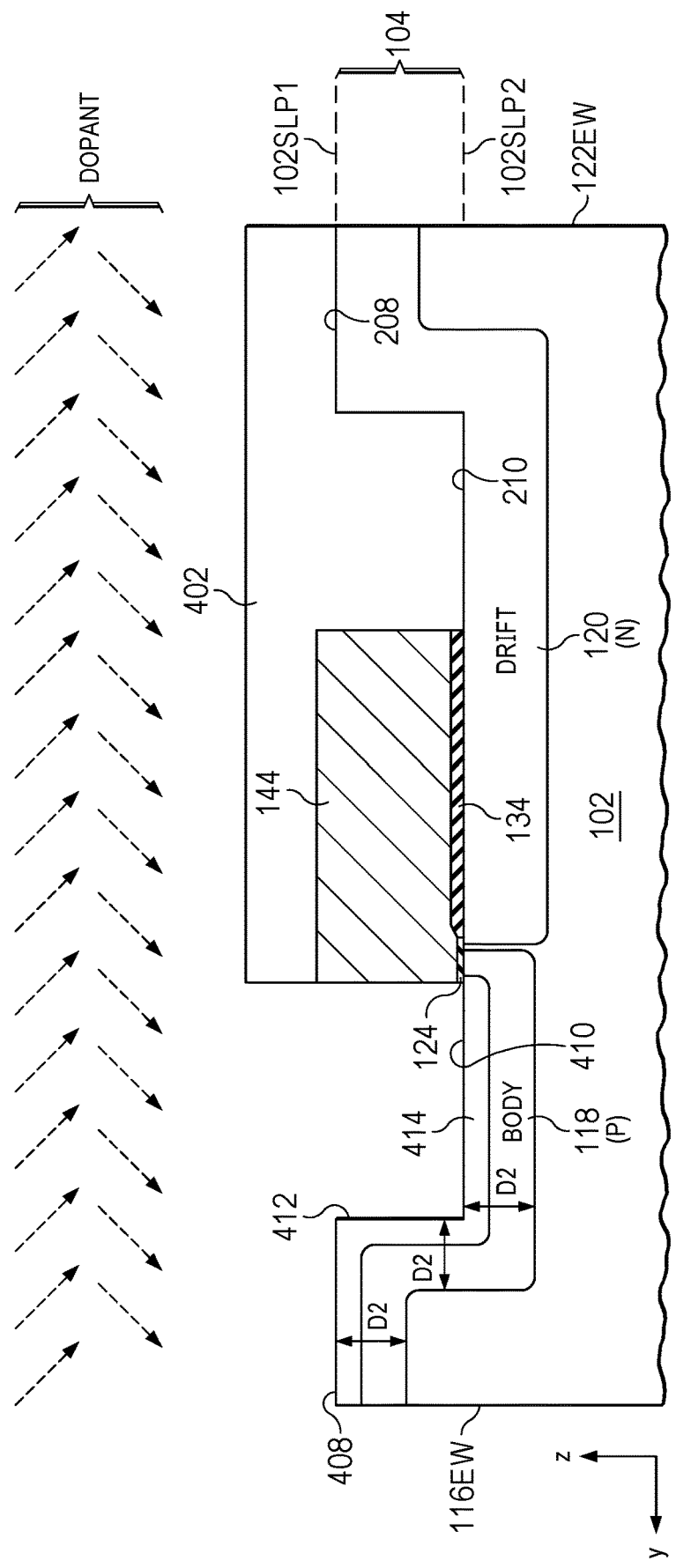

Each of FIGS. 4B through 4E is an additional view of FIG. 4A, corresponding to additional fabrication steps. Further, FIGS. 4B through 4E follow generally the same sequence as FIGS. 2B through 2E, althrough with etching and a doping in a different location in the substrate 102, as compared to FIGS. 2B through 2E. In FIG. 4B, a portion of the third stack layer 406 is removed, again shown generally by an etch and corresponding arrows. In FIG. 4C, a portion of the second stack layer 404 is removed, shown generally by an etch and corresponding arrows and in areas unmasked by the remaining portion of the third stack layer 406. In FIG. 4D, the remaining portion of the FIG. 4C third stack layer 406 is removed and then a selective (unmasked) portion of the first stack layer 402 is removed, shown by an etch and corresponding arrows and in areas unmasked by the remaining portion of the second stack layer 404 and transferring the pattern previously formed in the second stack layer 404 to the first stack layer 402. In FIG. 4E, the remaining portion of the FIG. 4D second stack layer 404 is removed and then a selective (unmasked) portion of the substrate 102 is doped, shown generally by dopants and corresponding arrows, where the doping occurs in areas unmasked by the remaining portion of the first stack layer 402, and the dopants provide a body 118. The FIG. 4E view generally shows the body 118 in a portion of the trench 106 (and the drain endwall 122EW). The body 118 generally has a nominal depth D2, less than D1 of the drift region 120 in FIGS. 2A through 2F, extending (e.g., normally) from each surface into which the dopants are introduced, including a third x-y plane surface 408 at the first surface level plane 102SLP1 and a fourth x-y plane surface 410 at the second surface level plane 102SLP2, as well as in a second x-z plane surface 412 along the end of the trench 106 where the endwall 116EW extends between the first surface level plane 102SLP1 and the second surface level plane 102SLP2.

Figure 4F:
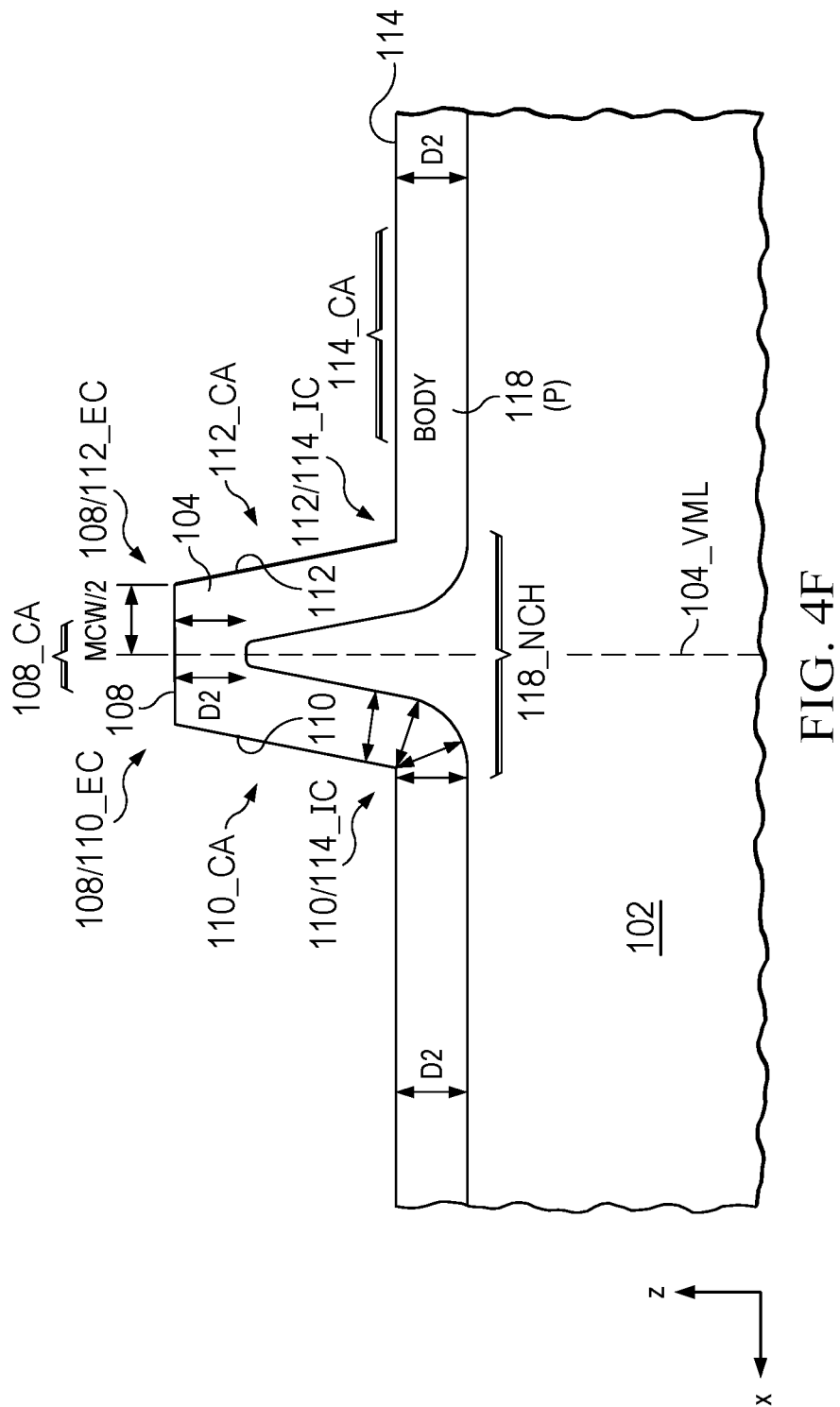
FIG. 4F is a view after the fabrication steps shown completed in FIG. 4E, but with the view taken along the body portion and perpendicular to the majority length of a corrugation member.

FIG. 4F is a view after the fabrication steps shown completed in FIG. 4E, but with the view taken along the body 118 and perpendicular to the majority length of the corrugation member 104, showing the body 118 in the corrugation member 104 and below the lower surface portion 114 that exists within the trench 106. In the FIG. 4F example, D2 is not only less than D1 (compare to FIG. 2F), but D2 is also less than MCW/2. Accordingly, when the step 916 forms the body 118, the dopants imparted to the upper portion 108 and the first and second lateral portions 110 and 112 again collide in the respective areas near the exterior corners 108/110_EC and 108/112_EC. However, centrally away from those corners, but along the same surfaces having respective edges that interface to form each corner, the dopants penetrate normal to the surface without collision from nearby adjacent surfaces, for example as shown in FIG. 4F in: (i) a central area 110_CA relative to the first lateral surface 110 and away from its corners 108/110_EC and 110/114_IC; (ii) a central area 112_CA relative to the second lateral surface 112 and away from its corners 108/112_EC and 112/114_IC; (iii) a central area 108_CA relative to the upper portion 108 and away from its corners 108/110_EC and 108/112_EC; and (iv) a central area 114_CA relative to the lower surface portion 114 and away from its corner 112/114_IC (with a mirror image to the left of the corrugation member 104 and relative to the interior corner 110/114_IC, but not labeled in FIG. 4F). In each of these central areas, the step 916 body dopants, where imparted away from corner interfaces that occur between adjacent surface edges, diffuse in a normal direction and to a doping length equal to the depth D2. Various arrows show this diffusion, normal to a respective surface, for example for the body 118 in the central area 114_CA in the negative z-dimension (downward) from the lower surface portion 114, from the central area 108_CA in the negative z-dimension (downward) from the upper portion 108, and inwardly toward the VML 104_VML from both the first and second lateral portions 110 and 112, in respective ones of the central areas 110_CA and 112_CA. Conversely, if D2 were larger than MCW/2, there is the increasing possibility that the doping length from both the first and second lateral portions 110 and 112 to the VML 104_VML would collide with dopants from both of those surfaces, and near the top of the corrugated member 104 with the additional collision of dopants from the upper portion 108. Accordingly, in each central area, that is, for the volume of semiconductor material where D2 reaches the volume from only one surface in various locations in FIGS. 4E and 4F, the diffusion length and dopant profile is the same or similar, whereas if a same volume location is reachable by dopants from plural surfaces due to an exterior corner (from connecting planes or along a convex curve) the dopant length may be longer than D2, while if a volume is located proximate an interior corner (from connecting planes or along a concave curve) the dopant length may be shorter than D2.

Comparing FIG. 4F to FIG. 2F, the respective examples illustrate implementing different transistor regions, for example the drift region 120 and the body 118, by adjusting or diffusion length with consideration to multiple adjacent surfaces from which the region is formed. These concepts may be used for additional transistor regions as illustrated below by choosing either shorter or longer diffusion lengths, while starting with a uniform deposition of dopants into all surfaces, which may be particularly desirable for the topographical complexities in the corrugated structure of the transistor 100. Further, the considerations illustrated in this document may be adapted based on the dimensions and shape of the transistor configuration, or to adapt to alternative corrugated transistors, based on the dimensions and shapes of various portions of the structure. For example, any of the trench width, depth, corrugation member height, angle of its lateral portions, and radii of its corners may be altered to impact the potential for dopant collision at exterior corners, or dopant divergence at interior corners, relative to the adjacent surfaces that form the particular corner. Any one or more of these attributes, along with dopant type and diffusion choices, may be adjusted or optimized to fulfill or target a device specification. As a result, the device will include non-parallel surfaces, for example the upper portion 108 (or the lower surface portion 114) versus either lateral portion 110 or 112, in which there are portions (e.g., central areas) of all of those surfaces in which a nominal and uniform diffusion length (D1, D2) is achieved for a device region, with other portions, primarily approaching or proximate a structure (e.g., corner) between those surfaces, in which diffusion length departs from the nominal diffusion length, particularly along what is shown as the x-dimension in the various Figures, that is, traversing the varying topology that arises from one corrugation member 104 to the next, and so forth (akin to peaks and valleys). In different examples of the transistor 100, a goal may be established along the x-dimension so that the length of each central area in that dimension is at least a certain percent of the entire length of the surface, althrough the percent may vary based on various factors as have been described. Accordingly, the example devices have been described with uniform dopant application methods on discontinuous (e.g., non-coplanar) surfaces, whereby it is anticipated that the diffusion length will be the same at the midpoint (halfway between opposing corners/edges) of each of those surfaces. In other words, in FIG. 4F by example, there will be a same diffusion length D2 for the body 118 at the midpoint of the central area 108_CA as for the body 118 at the midpoint of the central area 110_CA (or the central area 112_CA). Further, while FIG. 4F illustrates only a single corrugation member 104, by extension the same features will apply to a next adjacent corrugation member, so that a given portion of the lower surface portion 114 will have a first inner corner 112/114_IC as it transitions to a first of those corrugation members and a second inner corner 112/114_IC as it transitions to a second of those corrugation members; accordingly, at the midpoint between those two inner corners, the diffusion length also should be D2, to match that at the above-described midpoints of the central areas 108_CA, 110_CA, and 112_CA.

Also, in the illustrated example of an n-type device in which a p-type body 118 is desired (again, to support an NMOS device), the FIGS. 4E and 4F body region dopants may be boron, applied with appropriate attributes to achieve an average dopant concentration of $1e16/cm^3$ to $1e18/cm^3$. During the p-type doping of the body 118, the illustrated example also concurrently provides a higher concentration of n-type dopants, to form a source extending region 414, which like the body 118, forms in the exposed (unmasked) FIG. 4E areas (not shown in FIG. 4F due to the location of the cross-section). In an example, the n-type dopants are applied with attributes to achieve an average dopant concentration of 1e16/cm$^3$ to 1e18/cm$^3$, and at a depth such as 30-100 nm, that is, less than that of the body 118. After the body 118 and source extending region 414 are formed, the remaining portion of the first stack layer 402 is removed, while prior to that removal, again a portion of that first stack layer 402 provided a hard mask that blocked dopants to unexposed area of the substrate 102, with the precision facilitated from the multi-layer stack 400 (FIG. 4A) structure.

Figure 5A:
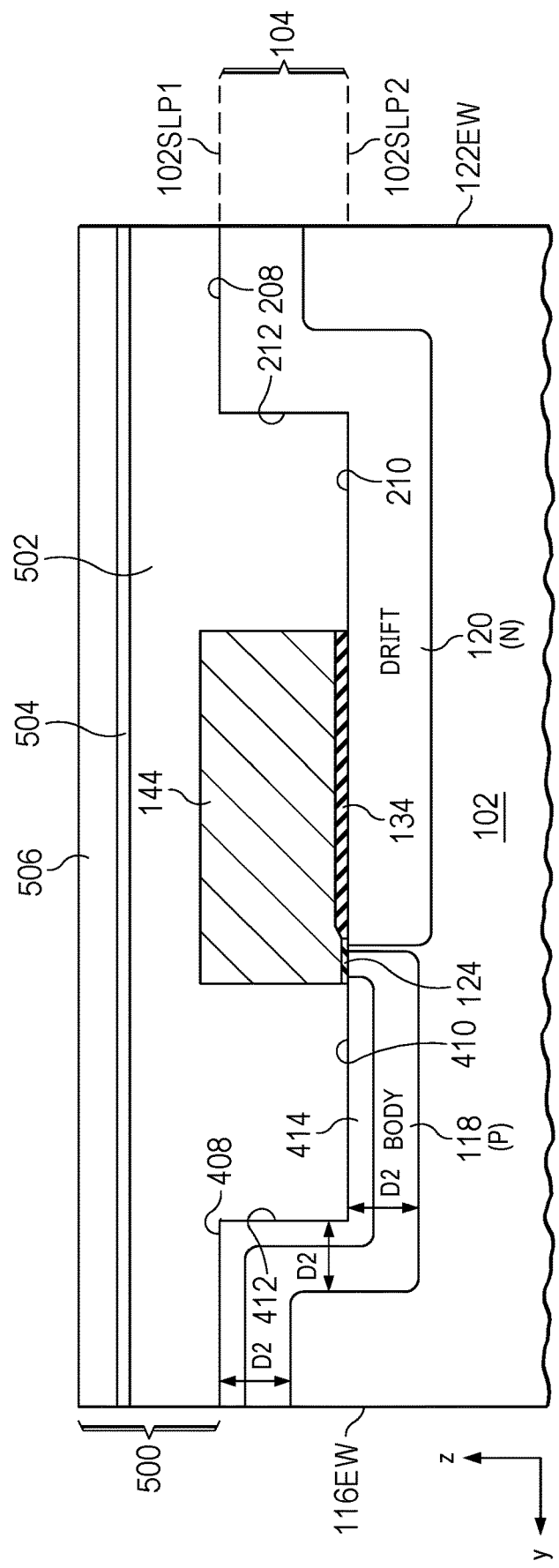
FIGS. 5A through 5E are successive views of FIG. 4E, illustrating additional fabrication steps and the formation of a transistor source and transistor drain.

FIG. 5A is a view of FIG. 4E, after additional fabrication and beginning a sequence comparable in many respects to that in FIGS. FIG. 2A through 2E (or 4A through 4E), but here directed to the formation of the source 116 and the drain 122 (and summarized in method step 918). Here, a multi-layer stack 500, again by example including at least three layers, is formed along exposed surface of the substrate 102, and it may include the same respective materials as the FIG. 2A multi-layer stack 200 or the FIG. 4A multi-layer stack 400. Accordingly, FIG. 5A illustrates, in the multi-layer stack 500, a first stack layer 502, closest to the substrate 102 and with a hard mask material, a second stack layer 504, adjacent, and abutting in an example, the first stack layer 502, as a pattern transfer material, and a third stack layer 506, adjacent, and abutting in an example, the second stack layer 504, as a pattern receiving material. The materials and manners of forming them may be the same as earlier described with respect to the multi-layer stack 200.

Figure 5B:
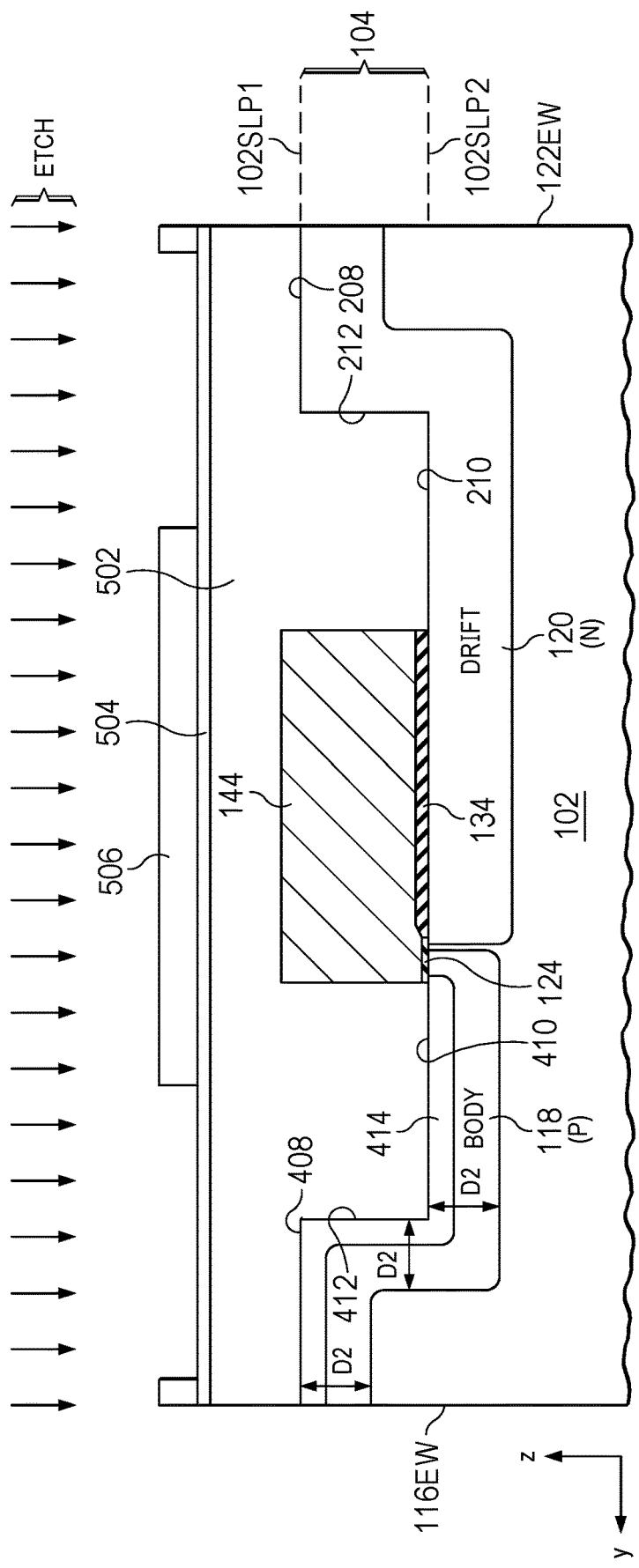
Figure 5C:
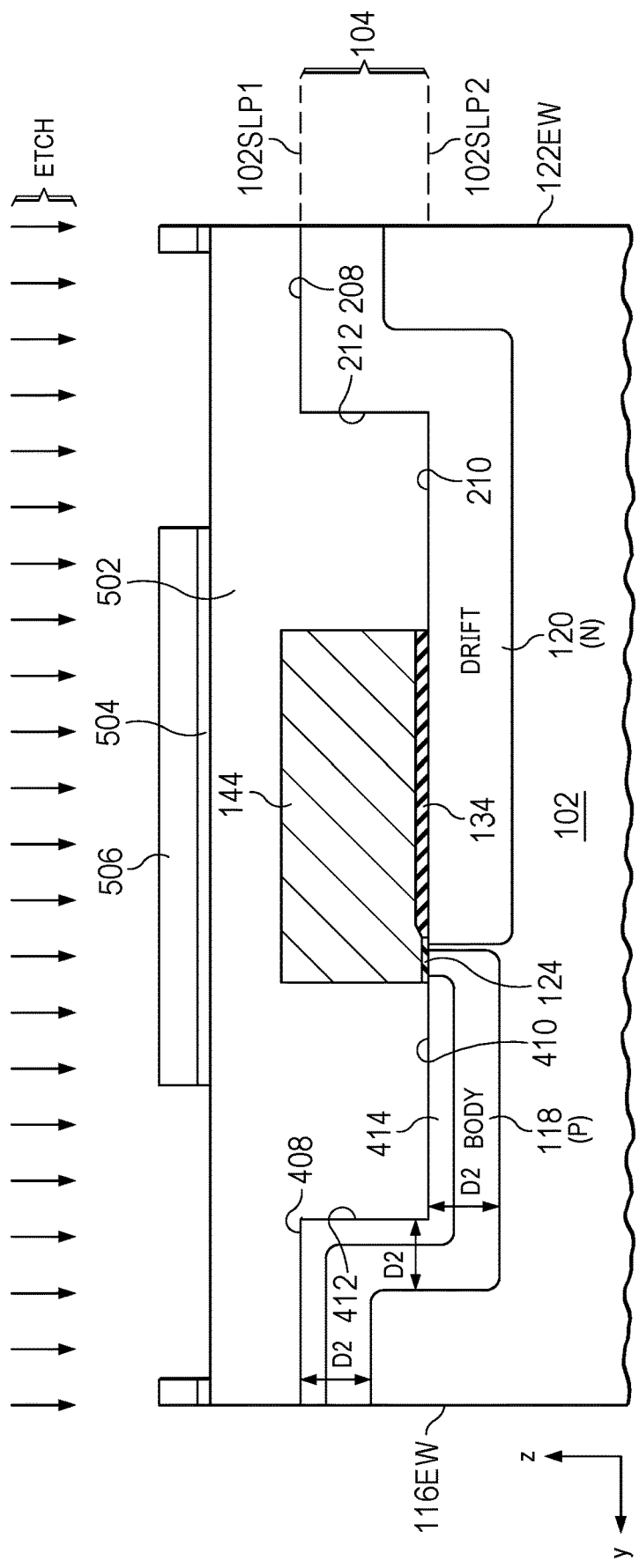
Figure 5D:
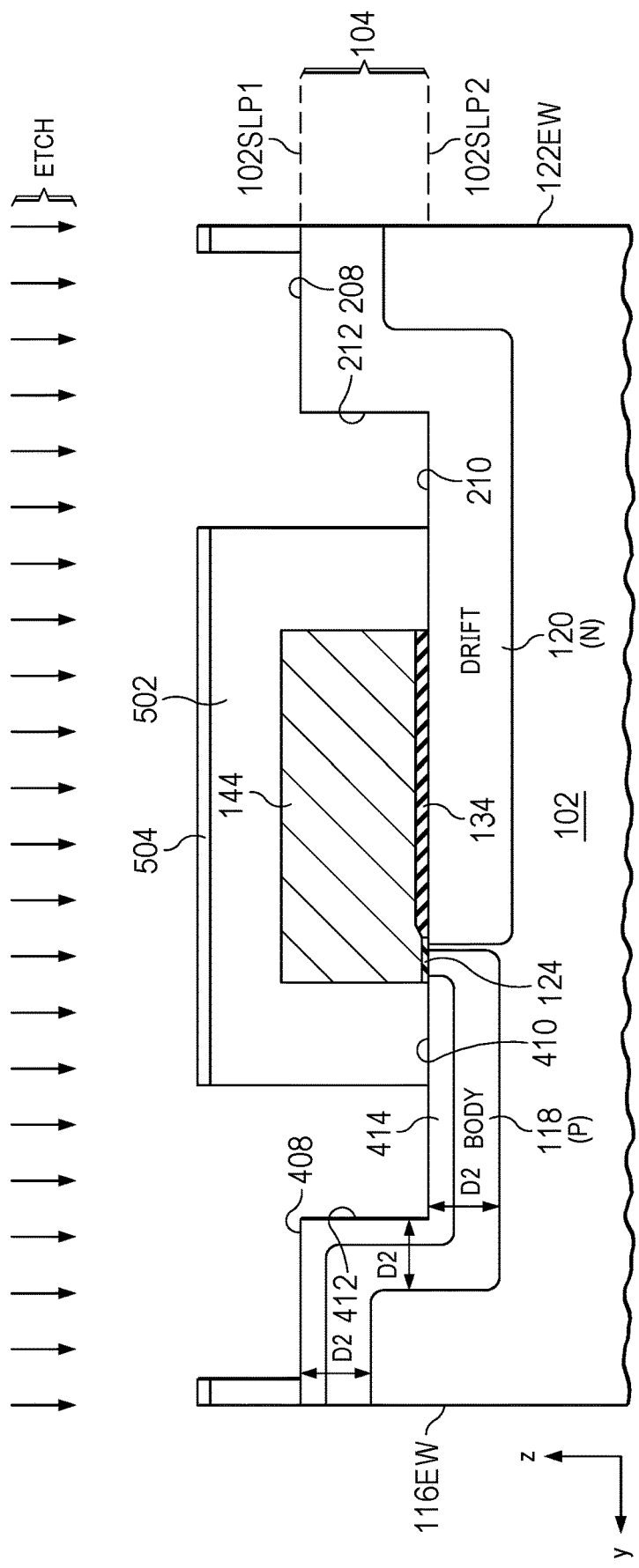
Figure 5E:
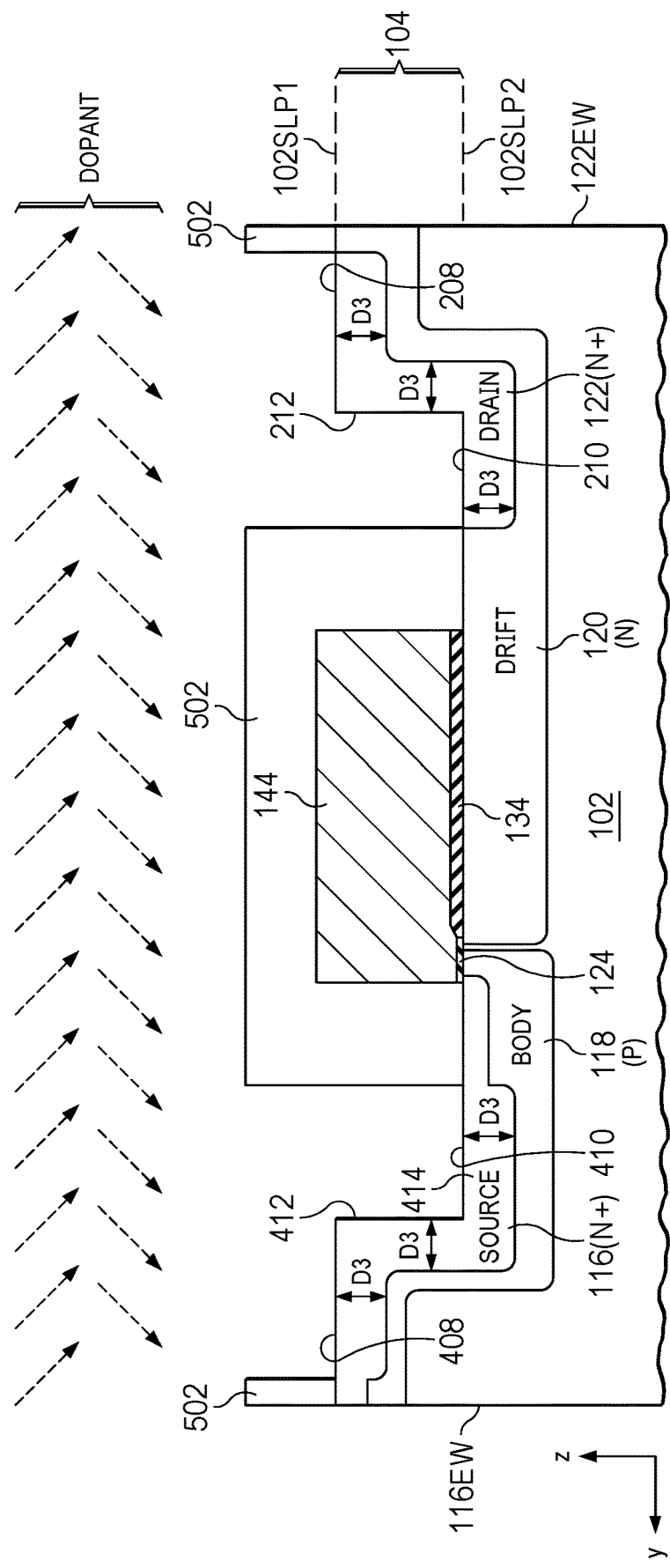

Each of FIGS. 5B through 5E is an additional view of FIG. 5A, corresponding to additional fabrication steps. Further, FIGS. 5B through 5E follow generally the same sequence as FIGS. 2B through 2E (or 4B through 4E), althrough with etching and doping in two different locations in the substrate 102, one corresponding to the source 116 and the other to the drain 122. In FIG. 5B, two portions of the third stack layer 506 are removed by etch, in FIG. 5C two portions of the second stack layer 504 are removed by an etch in areas unmasked by the remaining portion of the third stack layer 506, and in FIG. 5D the remaining portion of the FIG. 5C third stack layer 506 is removed and then two respective selective portions of the first stack layer 502 are removed by etch, in areas unmasked by the remaining portion of the second stack layer 504 (and transferring the pattern previously formed in the second stack layer 504 to the first stack layer 502). In FIG. 5E, the remaining portion of the FIG. 5D second stack layer 504 is removed and then two selective portions of the substrate 102 are doped in areas unmasked by the remaining portion of the first stack layer 502, acting as a hard mask, such that the dopants provide the source 116 through each of the above-introduced third x-y plane surface 408, fourth x-y plane surface 410, and the second x-z plane surface 212 (and a portion of the first and second lateral portions 110 and 112 corresponding to the source 116 in the y-z plane), and the dopants also provide the drain 122 through each of the above-introduced first x-y plane surface 208, second x-y plane surface 210, and (a portion of) the first x-z plane surface 212 (and a portion of the first and second lateral portions 110 and 112 corresponding to the drain 122 in the y-z plane). The source 116, like the body 118 as shown in FIG. 4F, has a similar shaped profile, including a notch 116NCH, but at a lesser depth D3, as compared to the nominal body depth D2. The doping may be achieved in various manners, including a concurrent vapor phase doping step, CVD doping step, gas phase deposition doping step, and a solid sublimation doping step. Each of the source 116 and the drain 122 has a nominal depth D3 from each surface into which the dopants are introduced, or as described below, as is the case in central areas, away from any planar discontinuities that cause diffusing collision or divergence.

Figure 5F:
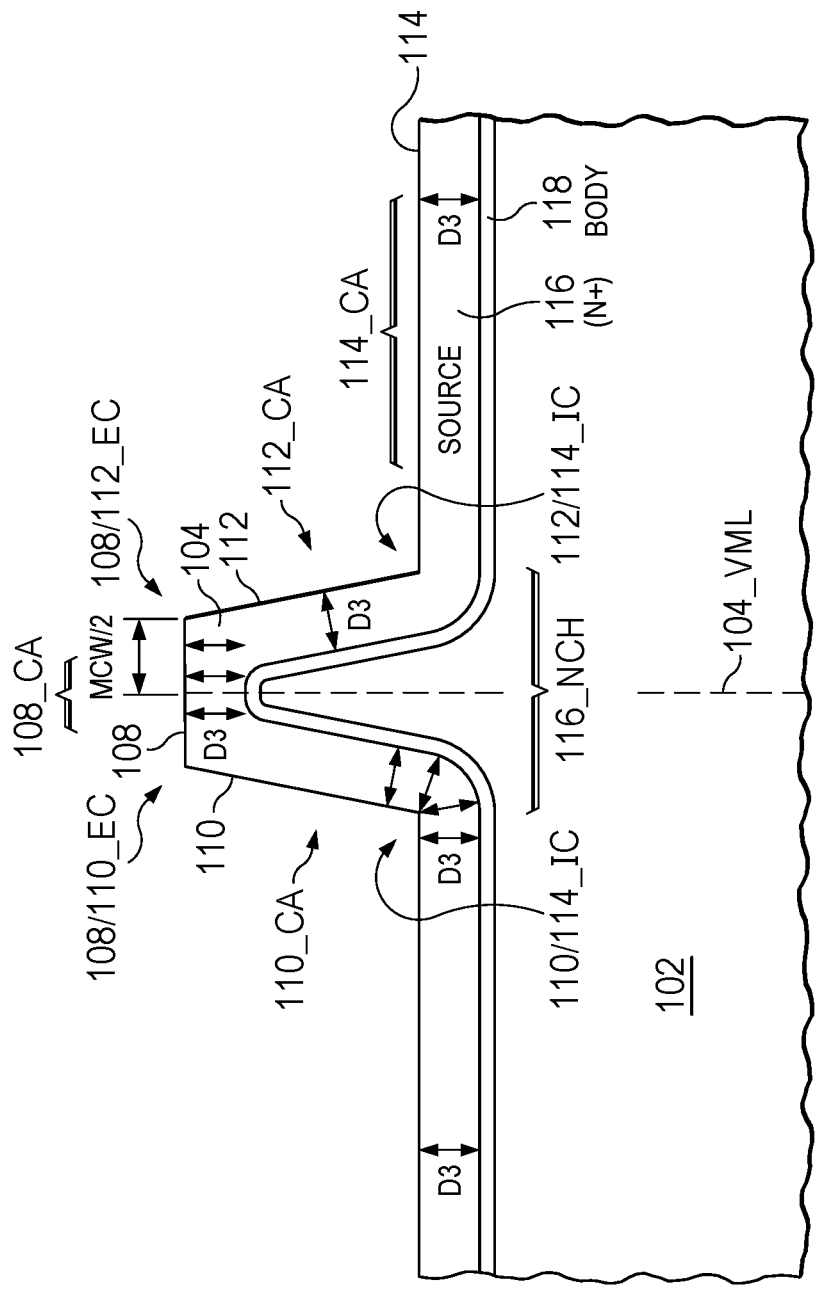
FIG. 5F is a view after the fabrication steps shown completed in FIG. 5E, but with the view taken along the source (and body) portion and perpendicular to the majority length of a corrugation member.

FIG. 5F is a view after the fabrication steps shown completed in FIG. 5E, but with the view taken along the body 118 and the source 116, and perpendicular to the majority length of the corrugation member 104 (so shifted in the positive y-dimension relative to FIG. 4F). Accordingly, FIG. 5F shows the body 118 in the corrugation member 104 and below the lower surface portion 114 that exists within the trench 106. FIG. 5F is comparable in some respects to FIG. 4F, in that the depth D3, like the FIG. 4F depth D2, is generally shown to extend in a normal direction from the surfaces provided by each of the upper portion 108, the lower surface portion 114, and the first and second lateral portions 110 and 112, where nominally doped volume of semiconductor material in locations reached from a singular centrally-located surface and at the depth D3 is the same or similar, whereas if a same volume location is reachable by dopants from plural surfaces due to an exterior corner (from connecting planes or along a convex curve) the dopant length may be longer than D3, while if a volume is located proximate an interior corner (from connecting planes or along a concave curve) the dopant length may be shorter than D3. Accordingly, here again the non-parallel surfaces of the upper portion 108 (or the lower surface portion 114) versus either the lateral portions 110 or 112 will include portions (e.g., central areas), such as at the midpoint of each respective such portion, in which the dopant diffusion length will be the same (D3), despite those surfaces not being parallel, and in response to the initial uniformity of dopants from the applicable fabrication method. Such attributes can be achieved in the x-dimension despite the changing topography, but again will diverge in that dimension when approaching or proximate a structure (e.g., corner) between those surfaces.

Also in the illustrated example in which an n-type source and drain are desired (again, to support an NMOS device), the FIG. 5E dopants may be phosphorous and/or arsenic, applied with appropriate attributes to achieve an average dopant concentration of 1e13/cm$^3$ to 1e16/cm$^3$. After the source 116 and the drain 122 are formed, the remaining portion of the first stack layer 502 is removed.

Figure 6A:
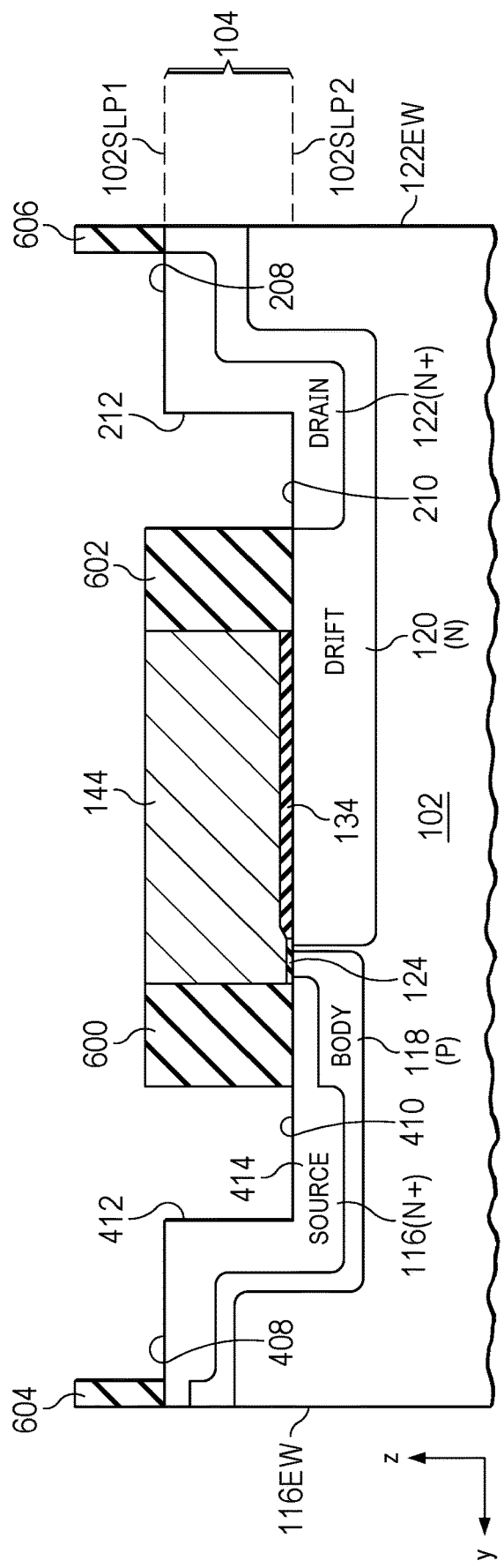
FIGS. 6A through 6C are successive views of FIG. 5E, illustrating additional fabrication steps and the formation of first lateral and then second sidewall silicides.

FIG. 6A is a view of FIG. 5E, after additional fabrication. In FIG. 6A (and method step 920), spacer oxides 600 and 602 are formed in the y-dimension outward from the stack of the combined gate/field plate conductor 144 and the gate dielectric 124/field plate dielectric 134, with the spacer oxide 600 isolating beyond an interior edge of the source 116 and the spacer oxide 602 isolating beyond an interior edge of the drain 122. Similarly, a spacer oxide 604 further isolates an exterior edge of the source 116, and a spacer oxide 606 further isolates an exterior edge of the drain 122.

Figure 6B:
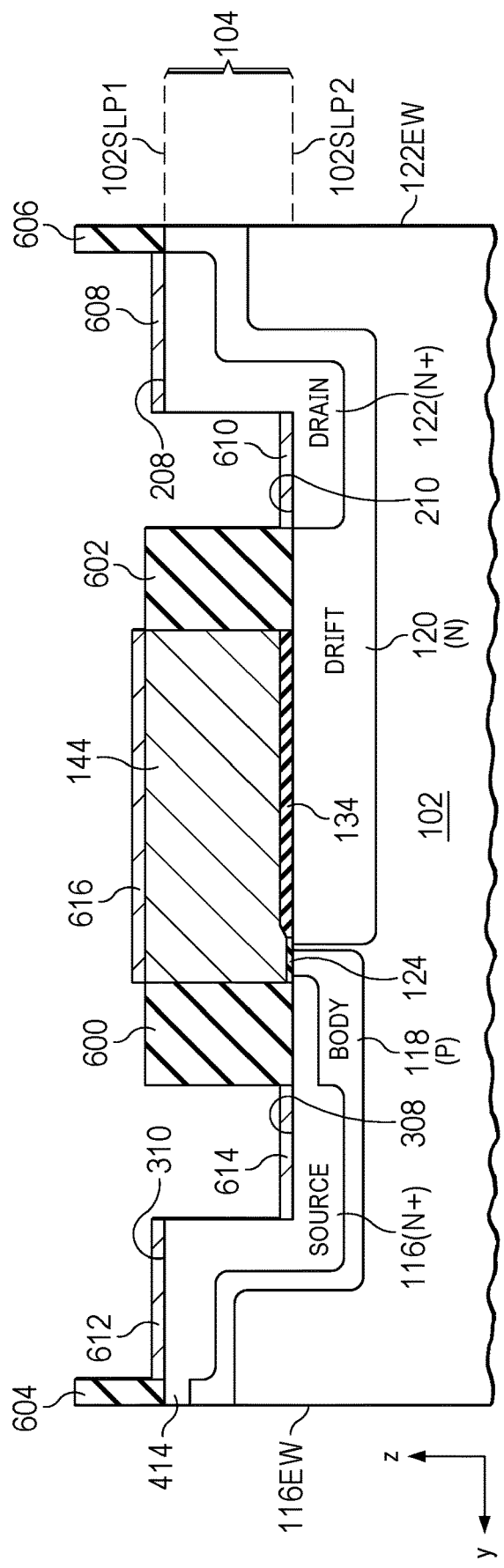

In FIG. 6B, metalized silicide conductors 608 and 610 are formed along exposed respective portions of the first x-y plane surface 208 and the second x-y plane surface 210, and similarly metalized silicide conductors 612 and 614 are formed along exposed respective portions of the third x-y plane surface 308 and the fourth x-y plane surface 310. Additionally, a metalized silicide conductor 616 is formed along the exposed upper surface of the combined gate/field plate conductor 144. The metalized silicide conductors 608, 610, 612, 614, and 616, particularly as forming along the x-y plane, may be formed as part of a same step that forms silicides for other planar transistors (e.g., CMOS devices) that also are formed in, or affixed relative to, the substrate 102, as such other planar transistors also will present x-y dimensioned surfaces, in which silicides are to be formed. Further, the FIG. 6B silicides each self-align to exposed silicon, in which case the process is sometimes referred to as a salicide (self-aligned silicide).

Figure 6C:
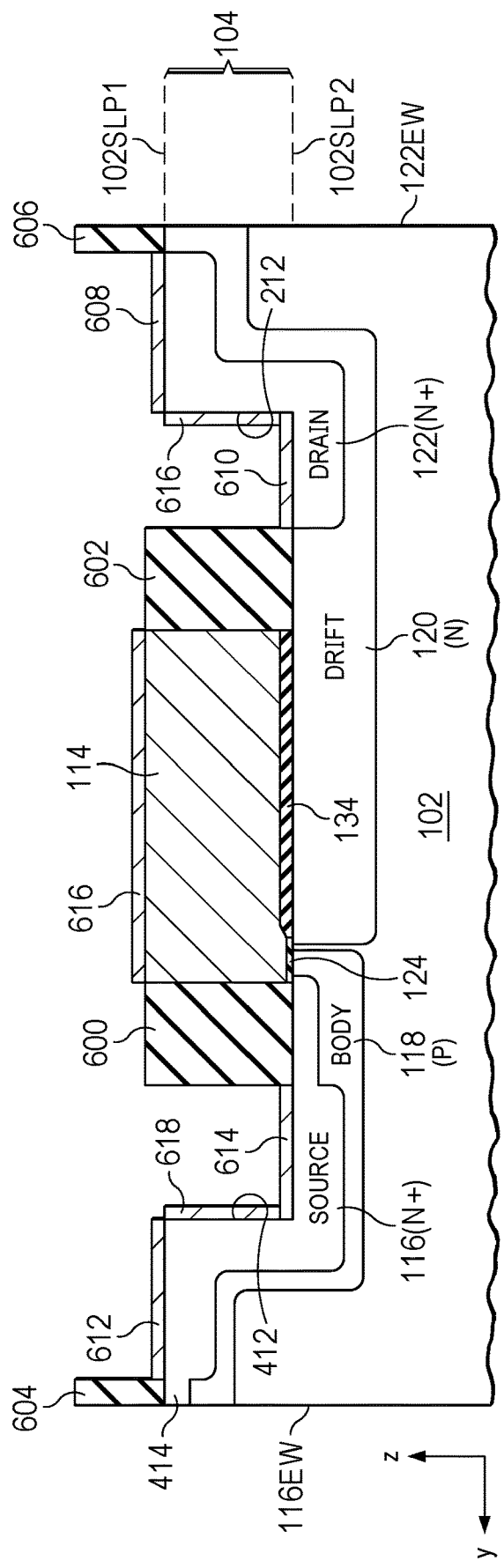

FIG. 6C is a view of FIG. 6B, after additional fabrication. In FIG. 6C, vertical plane metalized silicide conductors 616 and 618 are formed along exposed respective portions of the first x-z plane surface 212 and the second x-z plane surface 412. In one example, the metalized silicide conductors 616 and 618 are formed from a masked silicide process, whereby the FIG. 5B structures are masked, and then a pre-contact metal film, such as cobalt or nickel, is formed (e.g., sputtered; or Chemical Vapor deposited) along the first x-z plane surface 212 and the second x-z plane surface 412. The deposited metal is then further processed, for example annealing in a desirable pressure and environment to form metal silicides, which present in FIG. 6C as the metalized silicide conductors 616 and 618. Accordingly in this example, the vertical illustrated x-z plane oriented metalized silicide conductors 616 and 618 are potentially formed in either a separate process step or steps, as compared to the FIG. 6B horizontal x-y plane metalized silicide conductors 608, 610, 612, 614, and 616 or concurrently. Further in this regard, because of the location of the FIGS. 6B and 6C cross-sections, two other vertical planes, namely the y-z plane along either of the first and second lateral portion 110 and 112, is not visible; however, those planes also present a comparable issue to the FIGS. 6B and 6C for either the source 116 or the drain 122, that is, each plane is a vertical portion where metal is to be formed, so as to facilitate subsequent contact. Accordingly, the same step illustrated in FIG. 5C forming vertical metalization on the first x-z plane surface 212 or the second x-z plane surface 412 also forms vertical metalization on the y-z plane portions of the source 116 and the drain 122. In an alternative example, and provided a metalization process is used that is satisfactory in the y-z plane (in the vertical dimension, here shown as the z-dimension, protruding away from the second surface level plane 102SLP2), then that same process may be used to form, for example concurrently, the FIG. 6B x-z plane metalized silicide conductors 608, 610, 612, 614, and 616.

FIG. 7 is a view of FIG. 6D, after additional fabrication. In FIG. 7 (and FIG. 9 method step 922), a thick oxide layer 700 is formed above the FIG. 6D structure, for example by depositing an oxide having a thickness between 100 and 1,000 nm and subsequently planarizing the layer. Thereafter, three "contact" holes are formed through the thick oxide layer 700, and each hole is filled with deposited metal(s) to respectively provide a first contact 702 that electrically couples to the source 116 by contacting one or more of metalized silicide conductors 612, 614, and 618, a second contact 704 that electrically coupled to the combined gate/field plate conductor 144 by the metalized silicide conductor 616, and a third contact 706 that electrically couples to the drain 122 by contacting one or more of metalized silicide conductors 608, 610, and 616 to the drain 122. More particularly for the first contact 702, it contacts a respective portion of each of the metalized silicide conductors 612 and 614 in the x-y plane, and the first contact 702 also contacts a respective portion of the metalized silicide conductor 618 in the x-z plane (and the vertical source metalization in the y-z plane, on both of the first and second lateral portions 110 and 112). Accordingly, the conformal formation of the vertical metalized silicide conductor 618, along the x-z (and y-z) plane, further facilitates a favorable electrical contact to the first contact 702. Similarly, for the third contact 706, it contacts a respective portion of each of the metalized silicide conductors 608 and 610 in the x-y plane, and the third contact 706 also contacts a respective portion of the metalized silicide conductor 616 in the x-z plane (and the vertical drain metalization in the y-z plane, on both of the first and second lateral portions 110 and 112). Accordingly, the conformal formation of the metalized silicide conductor 616, along the x-z (and y-z) plane, further facilitates a favorable electrical contact to the third contact 706.

FIG. 8 is a cross-section view of the FIG. 1C folded DEMOS transistor 100 at the same stage of fabrication stage as in FIG. 7, with the view instead taken across a major axis of a corrugation member 104. Generally, the prior description and corresponding illustrations provide the fabrication steps preceding and up to FIG. 8. Across a corrugation member 104, however, the first contact 702 contacts only the metalized silicide conductor 612 (atop the first surface level plane 102SLP1), and similarly the third contact 706 contacts only the metalized silicide conductor 608 (also atop the first surface level plane 102SLP1). Additionally, also in this cross-sectional region, again the respective depth D3 of both the source 116 and the drain 122, D1 of the drift region 120, and D2 of the body 118, are the same as in the trench 106 area shown in FIGS. 2A through 6E, thereby facilitating a relatively uniform respective electrical path generally in the x-dimension across the various corrugated planes, and generally in the y-dimension across the transistor channel (generally between the source 116 and the drain 122).

From the above, one skilled in the art should appreciate that examples are provided for semiconductor fabrication and devices, for example with respect to MOS transistor, including a DEMOS and/or LDMOS transistor, with improved width by corrugation members. Such examples also may improve dopant concentration uniformity, in any one or more of the transistor source, drain, body, or drift region. Such examples also may improve metalization for contacts, including in surfaces extending away from the trench bottoms, such as along corrugated lateral portions or endwalls. Still other benefits are the flexibility of variations for different examples, in that, for example, certain benefits may be achieved from differing processes or implementing only portions, or adding additional steps/structures, compared to the entire example shown in the provided figures. For example, while FIGS. 5A through 5E illustration multi-level masking for doping relatively high dopant concentration source/drain regions, a comparable set of steps may be used, albeit with lesser dopant levels, to form LDD regions. As a final example, additional modifications are possible in the described embodiments, and other embodiments are possible, within the scope of the following claims.

What is claimed is:

1. A method of forming a semiconductor device, comprising:
    providing a substrate including at least a portion of a semiconductor material;
    forming a plurality of corrugation members of the semiconductor material, each corrugation member in the plurality of corrugation members including a top surface, and a first and second sidewall extending from the top surface to a lower surface;
    forming a contiguous transistor drain extending through a first volume of each of the corrugation members and a first lower surface volume extending into the semiconductor material from the lower surface by initially diffusing a dopant in a uniform manner normal to a first portion of the top surface, a first portion of the first sidewall, a first portion of the second sidewall, and a first portion of the lower surface.

2. The method of claim 1, further comprising:
forming a contiguous transistor source extending through a second volume of each of the corrugation members and a second lower surface volume extending into the semiconductor material from the lower surface by initially diffusing a dopant in a uniform manner normal to a second portion of the top surface, a second portion of the first sidewall, a second portion of the second sidewall, and a second portion of the lower surface; and wherein:
forming the contiguous transistor source diffuses to a same diffusion length at and normal from a respective midpoint of each of the second portion of the top surface, the second portion of the first sidewall, the second portion of the second sidewall, and the second portion of the lower surface; and
forming the contiguous transistor drain diffuses to the same diffusion length at and normal from a respective midpoint of each of the first portion of the top surface, the first portion of the second sidewall, the first portion of the second sidewall, and the first portion of the lower surface.

3. The method of claim 2, wherein each respective midpoint is along a dimension extending from a first corrugation member of the plurality of corrugation members to a second corrugation member of the plurality of corrugation members, and halfway between opposing edges, in the dimension, of the respective surface.

4. The method of claim 1, wherein each of the steps of forming the contiguous transistor drain includes forming a masking stack including at least three masking layers.

5. The method of claim 4, wherein the masking stack includes a photoresist layer, a pattern transfer layer, and a pattern receiving layer.

6. The method of claim 1, further comprising:
in a first step, forming metalization using silicides adjacent selected portions of the top surface of each corrugation member corresponding to the contiguous transistor drain; and
in a second step, forming metalization using conformal metal silicide film adjacent selected portions of the first and second sidewall of each corrugation member corresponding to the contiguous transistor drain.

7. The method of claim 6, wherein the silicides include self-aligned silicides.

8. The method of claim 6, wherein the first step and the second step occur separately.

9. The method of claim 1, further comprising forming metalization using conformal metal film adjacent selected portions of the first and second sidewall of each corrugation member corresponding to the contiguous transistor drain.

10. A semiconductor device, comprising:
a substrate including at least a portion of a semiconductor material;
a corrugation member, the corrugation member including a top surface of the semiconductor material, a first lateral portion extending from the top surface to a first corresponding lower surface of the semiconductor material, and a second lateral portion extending from the top surface to a second corresponding lower surface of the semiconductor material;
a transistor body in the semiconductor material, the transistor body having a first conductivity type, the transistor body further including a first portion in the first corresponding lower surface and a first portion in the second corresponding lower surface;
a transistor source in the semiconductor material, the transistor source having a second conductivity type complementary to the first conductivity type, the transistor source having a first diffusion length at a midpoint of a first portion aligned with the top surface, a second portion aligned with the first lateral portion, and a third portion aligned with the second lateral portion, the transistor source further including a second portion in the first corresponding lower surface and a second portion in the second corresponding lower surface; and
a transistor drain in the semiconductor material, the transistor drain having the second conductivity type, the transistor drain further including a third portion in the first corresponding lower surface and a third portion in the second corresponding lower surface.

11. The semiconductor device of claim 10, further comprising a transistor drift region in the semiconductor material, the transistor drift region having a fourth portion aligned with each of the top surface, the first lateral portion, and the second lateral portion, the transistor drift region having a second diffusion length in a fourth portion in the first corresponding lower surface and a fourth portion in the second corresponding lower surface.

12. The semiconductor device of claim 10, further comprising:
first metal silicide conductors adjacent respective portions of the transistor source and the transistor drain in a first plane aligned with the top surface; and
second metal silicide conductors adjacent respective portions of the transistor source and the transistor drain in a second plane aligned with the first lateral portion or a third plane aligned with the second lateral portion.

13. The semiconductor device of claim 10, wherein:
the transistor body has a second diffusion length at a midpoint of a fourth portion aligned with the top surface, and at a midpoint of a fifth portion aligned with the first lateral portion, and at a midpoint of a sixth portion aligned with the second lateral portion; and
the transistor drain has the first diffusion length at a midpoint of a seventh portion aligned with the top surface, an eighth portion aligned with the first lateral portion, and a ninth portion aligned with the second lateral portion.

14. The semiconductor device of claim 13, wherein the corrugation member is a first corrugation member and the top surface is a first top surface, the semiconductor device further comprising:
a second corrugation member spaced apart from the first corrugation member, the second corrugation member including a second top surface of the semiconductor material, a third lateral portion extending from the second top surface to the first corresponding lower surface of the semiconductor material, and a fourth lateral portion extending from the second top surface to a third corresponding lower surface of the semiconductor material; and
wherein:
the transistor source extends continuously from the first corrugation member to the second corrugation member, the transistor source having the first diffusion length at a midpoint of a tenth portion aligned with the second top surface, an eleventh portion aligned with the third lateral portion, and a twelfth portion aligned with the fourth lateral portion; and
the transistor drain extends continuously from the first corrugation member to the second corrugation member, the transistor drain having the first diffusion length at a midpoint of a thirteenth portion aligned with the second top surface, a fourteenth portion aligned with the third lateral portion, and a fifteenth portion aligned the fourth lateral portion.

15. The semiconductor device of claim 10, wherein the transistor source having the first diffusion length at the midpoint of the first portion aligned with the top surface, the first diffusion length at the midpoint of the second portion aligned with the first lateral portion, and the first diffusion length at the midpoint of the third portion aligned with the second lateral portion do not overlap each other within the corrugation member.

16. The semiconductor device of claim 10, further comprising:
  a gate dielectric layer disposed over and interfacing with the top surface, the first lateral portion, and the second lateral portion of the corrugation member; and
  a gate electrode layer disposed over the gate dielectric layer and extending along the top surface, the first lateral portion, and the second lateral portion of the corrugation member.

17. The method of claim 1, wherein:
  the contiguous transistor drain diffuses into each corrugated member a first diffusion length at and normal from a midpoint of the first portion of the top surface, a second diffusion length at and normal from a midpoint of the first portion of the first sidewall, and a third diffusion length at and normal from a midpoint of the first portion of the second sidewall, the first, second and third diffusion lengths are non-overlapping with respect to each other; and
  the second diffusion length is equal to the third diffusion length.

18. The method of claim 1, wherein the first portion of the first sidewall, the first portion of the second sidewall, or the first portion of the lower surface of each corrugation member is exposed after forming the contiguous transistor drain.

19. The method of claim 1, wherein the first portion of the first sidewall, the first portion of the second sidewall, and the first portion of the lower surface of each corrugation member are exposed after forming the contiguous transistor drain.

20. The method of claim 1, further comprising forming a contiguous transistor source extending through a second volume of each of the corrugation members and a second lower surface volume extending into the semiconductor material from the lower surface by initially diffusing a dopant in a uniform manner normal to a second portion of the top surface, a second portion of the first sidewall, a second portion of the second sidewall, and a second portion of the lower surface; and
  wherein the second portion of the first sidewall, the second portion of the second sidewall, or the second portion of the lower surface of each corrugation member is exposed after forming the contiguous transistor source.

21. The method of claim 1, wherein the dopant is a first dopant, the method further comprising:
  forming, prior to forming the contiguous transistor drain, a contiguous drift region extending through a second volume of each of the corrugation members and a second lower surface volume extending into the semiconductor material from the lower surface by initially diffusing a second dopant in a uniform manner normal to a second portion of the top surface, a second portion of the first sidewall, a second portion of the second sidewall, and a second portion of the lower surface.

22. The method of claim 1, further comprising:
  forming, prior to forming the contiguous transistor drain, a contiguous gate dielectric layer interfacing with a second portion of the top surface, a second portion of the first sidewall, and a second portion of the second sidewall of each corrugation member and further interfacing with a second portion of the lower surface; and
  forming a contiguous gate electrode layer over the contiguous gate dielectric layer and extending along the top surface, the first sidewall, and the second sidewall of each corrugation member and further extending along the lower surface.

* * * * *